United States Patent
Kai

(10) Patent No.: US 8,582,984 B2
(45) Date of Patent: Nov. 12, 2013

(54) WAVEFORM CONTROLLER, RESPONSIVE ELEMENT MODULE, OPTICAL SWITCH APPARATUS, RESPONSIVE ELEMENT AND OPTICAL SWITCH APPARATUS CONTROL METHOD

(75) Inventor: Yutaka Kai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 588 days.

(21) Appl. No.: 12/621,130

(22) Filed: Nov. 18, 2009

(65) Prior Publication Data

US 2010/0123945 A1 May 20, 2010

(30) Foreign Application Priority Data

Nov. 20, 2008 (JP) .................................. 2008-296398

(51) Int. Cl.
*H04B 10/00* (2013.01)
*H04J 14/02* (2006.01)
*H04B 10/572* (2013.01)

(52) U.S. Cl.
CPC .................................. *H04B 10/572* (2013.01)
USPC .............................. 398/196; 398/95; 398/162

(58) Field of Classification Search
USPC ........... 398/33, 37, 38, 93–95, 158, 160, 162, 398/192, 197
See application file for complete search history.

(56) References Cited

U.S. PATENT DOCUMENTS

| | | | |
|---|---|---|---|
| 5,448,589 A * | 9/1995 | McKibben ..................... | 375/230 |
| 5,621,766 A * | 4/1997 | Bakke et al. .................. | 375/340 |
| 5,793,510 A * | 8/1998 | Samejima et al. ............ | 398/154 |
| 6,522,803 B1 | 2/2003 | Nakajima et al. | |
| 6,909,853 B1 * | 6/2005 | Yamashita .................... | 398/177 |
| 7,123,846 B2 * | 10/2006 | Tateyama et al. ............ | 398/209 |
| 7,254,345 B2 * | 8/2007 | Suzaki et al. ................ | 398/202 |
| 7,277,643 B2 * | 10/2007 | Baba et al. .................... | 398/155 |
| 7,317,873 B2 * | 1/2008 | Aoki .............................. | 398/45 |
| 7,356,257 B2 * | 4/2008 | Kitajima et al. ............... | 398/45 |
| 2007/0047957 A1 | 3/2007 | Iio et al. | |
| 2008/0212978 A1* | 9/2008 | Boscolo et al. ............... | 398/175 |

FOREIGN PATENT DOCUMENTS

| | | |
|---|---|---|
| JP | 7-335960 | 12/1995 |
| JP | 9-36471 | 2/1997 |
| JP | 2000-341728 | 12/2000 |
| JP | 2000-341738 | 12/2000 |
| JP | 2003-149613 | 5/2003 |
| JP | 2007-60333 | 3/2007 |
| JP | 2008-61167 | 3/2008 |

OTHER PUBLICATIONS

Office Action issued by the Japanese Patent Office on Nov. 13, 2012 in the corresponding Japanese patent application No. 2008-296398.

* cited by examiner

*Primary Examiner* — Dalzid Singh
(74) *Attorney, Agent, or Firm* — Staas & Halsey LLP

(57) ABSTRACT

A waveform controller includes a monitor configured to monitor a waveform of an output pulse obtained by the response of a responsive element to a driving signal supplied thereto and a driving waveform shaper configured to shape a waveform of the driving signal based on a monitoring result obtained by the monitor.

19 Claims, 18 Drawing Sheets

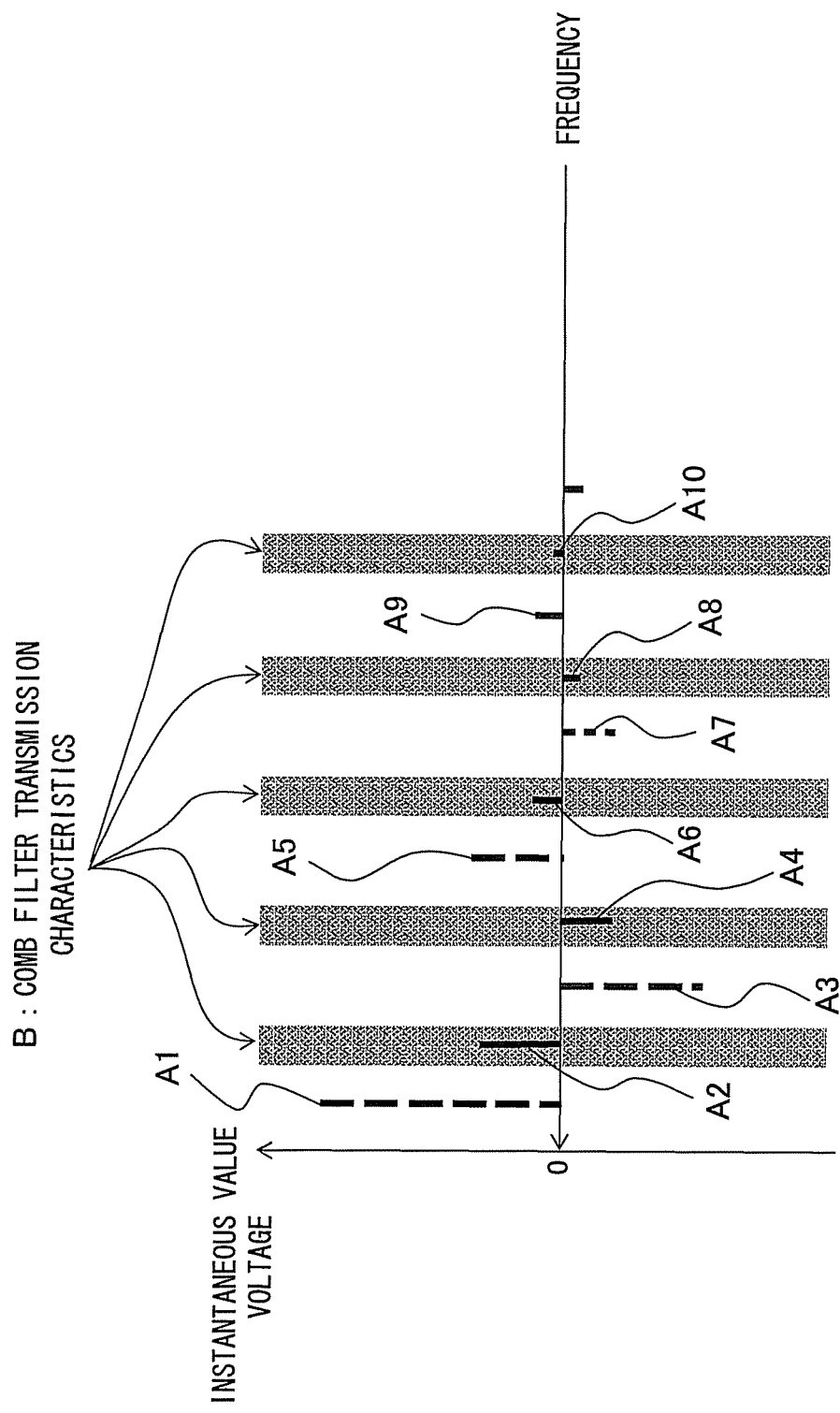

ODD-ORDER +25% EVEN-ORDER

ODD-ORDER +10% EVEN-ORDER

ONLY ODD-ORDER HARMONIC

ODD-ORDER −10% EVEN-ORDER

ODD-ORDER −25% EVEN-ORDER

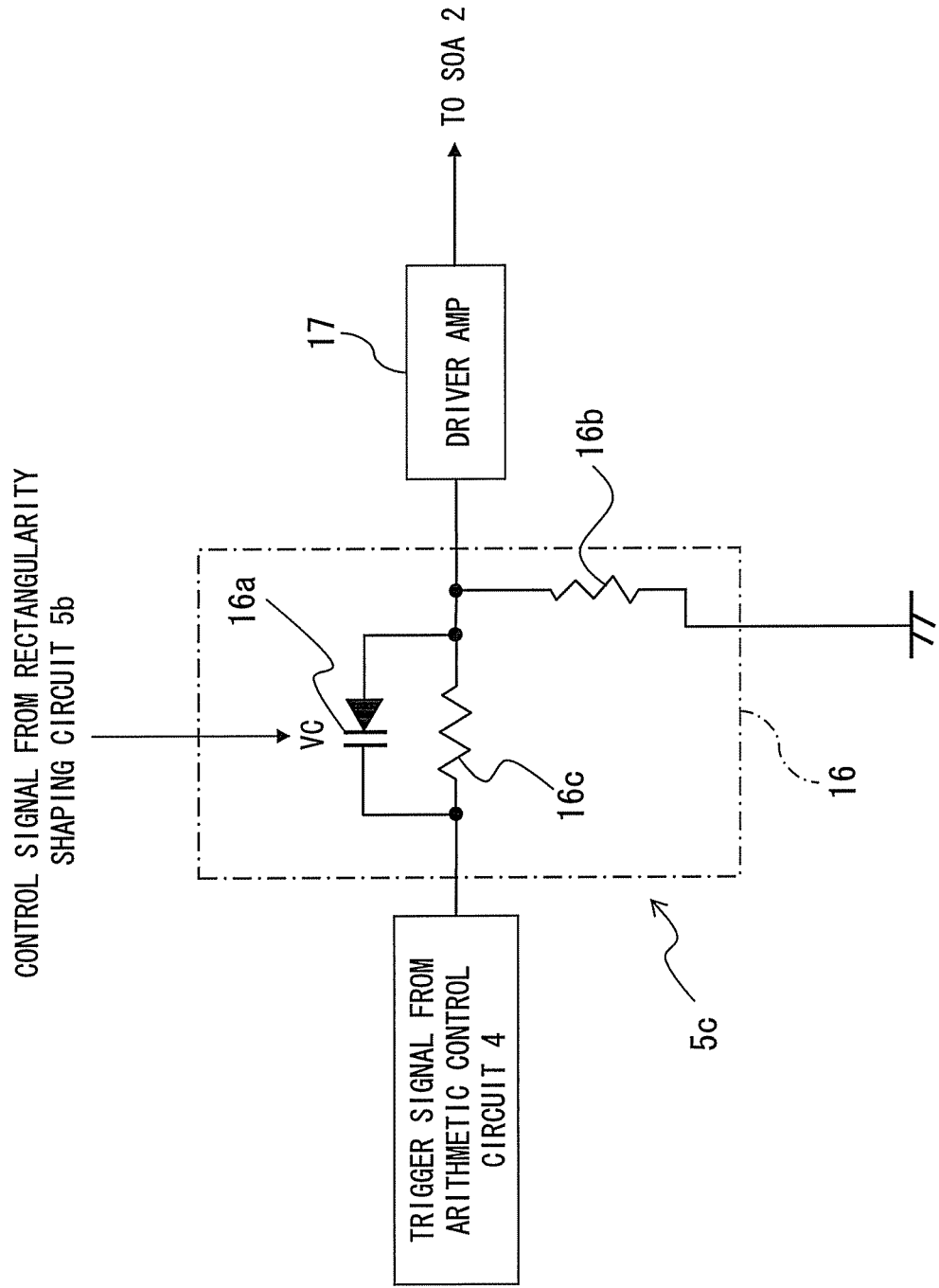

a1: OPTICAL WAVEFORM
b1: FILTER CIRCUIT OUTPUT ELECTRIC WAVEFORM a2: OPTICAL WAVEFORM
b2: FILTER CIRCUIT OUTPUT ELECTRIC WAVEFORM a3: OPTICAL WAVEFORM
b3: FILTER CIRCUIT OUTPUT ELECTRIC WAVEFORM

US 8,582,984 B2

WAVEFORM CONTROLLER, RESPONSIVE ELEMENT MODULE, OPTICAL SWITCH APPARATUS, RESPONSIVE ELEMENT AND OPTICAL SWITCH APPARATUS CONTROL METHOD

CROSS REFERENCE TO RELATED APPLICATION

This application is based upon and claims the benefit of priority of the prior Japanese Patent Application No. 2008-296398, filed on Nov. 20, 2008, the entire contents of which are incorporated herein by reference.

FIELD

Various embodiments described herein relate to a waveform controller, a responsive element module, an optical switch apparatus, a responsive element and an optical switch apparatus control method.

BACKGROUND

In not a few cases of elements or the like applied to an optical signal processing system and/or an optical communication system, an optical pulse having a rectangular wave shape is assumed as one having an ideal optical waveform to be handled.

For example, an optical element such as a SOA (Semiconductor Optical Amplifier) is driven by an electric signal (driving signal) switched between ON and OFF on a time axis, and is applied as a gate switch for performing switching of conduction/shutoff of input light. As a result of the switching of the driving signal between conduction and shutoff, output light from the SOA becomes an optical pulse that is switched between ON and OFF on a time axis. The optical pulse output from the SOA is often required to have a waveform close to a true (ideal) rectangular wave shape.

Also, some of electronic devices handling binary digital electric signals include an internal element, wiring or the like for which a binary rectangular wave signal is ideal as a signal conducted therethrough. Examples of such electronic devices include transmission line devices such as a memory, a buffer, a modulator, and a high-speed input/output interface device. Also, in such electronic devices, it is often required to allow a signal waveform to be easily shaped into an optimal rectangular shape (see Patent Document 1: Japanese Laid-open Patent Publication No. 9-36471, and Patent Document 2: Japanese Laid-open Patent Publication No. 2000-341728).

SUMMARY

A waveform controller includes a monitor configured to monitor a waveform of an output pulse obtained by a response of a responsive element to a driving signal supplied thereto and a driving waveform shaper configured to shape a waveform of the driving signal based on a monitoring result obtained by the monitor.

The object and advantages of the various embodiments will be realized and attained by means of the elements and combinations particularly pointed out in the claims.

It is to be understood that both the foregoing general description and the following detailed description are exemplary and explanatory and are not restrictive of the various embodiments, as claimed.

BRIEF DESCRIPTION OF THE DRAWINGS

FIG. 4 illustrates operational functions of the harmonic component extraction part according to the first embodiment.
FIG. 6 illustrates one example of a gate switch driving circuit.

DESCRIPTION OF THE PREFERRED EMBODIMENTS

Hereinafter, embodiments will be described with reference to the drawings. It is to be noted that the embodiments described below are provided for illustrative purposes only, and are not intended to exclude various changes or technical applications that are not specified below. In other words, the present embodiments may be implemented by making various changes thereto without departing from the scope of the present invention.

[A] First Embodiment

Currently, a WDM (Wavelength Division Multiplexing) transmission system is a dominating mainline optical communication network system. However, in the future, progress toward an optical packet/burst switching network system, in which an optical signal path is switched, is expected in terms of improvement of network utilization efficiency.

In order to improve the efficiency of line usage, the optical packet/burst switching network system is thought to require the functions of dividing an optical signal into optical packets, and performing an exchange/route switching process on a packet-by-packet basis while maintaining the optical signal.

In performing the above-described exchange and/or route switching on a packet-by-packet basis in the device having such functions, it is expected that the switching process can be performed in a time dimension at least smaller than the order of milliseconds, e.g., in the order of microseconds to nanoseconds.

In one example, there is provided a distributing/merging type optical packet switch system in which elements such as SOAs (Semiconductor Optical Amplifiers) are utilized as gate switches, and a plurality of these switches are arranged in a matrix. In the distributing/merging type optical packet switch system, with respect to a port number N, N×N or more switching elements will be needed.

Figure 1:
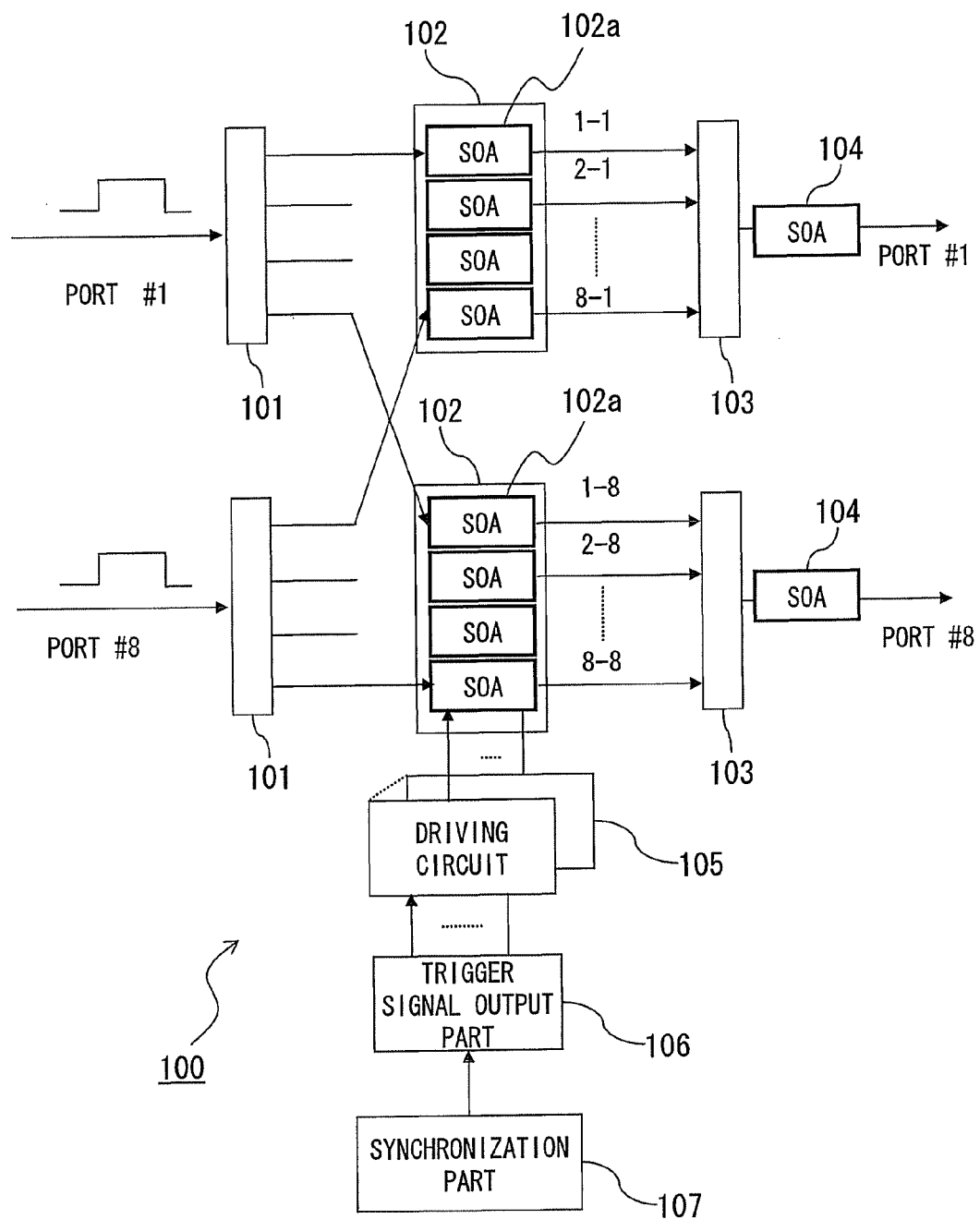
FIG. 1 illustrates one example of an optical packet switch.

FIG. 1 illustrates an example of a distributing/merging gate switch type optical packet switch (optical switch apparatus or interconnect system) 100 having eight input ports (#1 to #8) and eight output ports (#1 to #8). An optical packet signal input from each of the eight ports is distributed to eight paths through a 1:8 coupler 101 provided for each input port. An 8:8 optical gate switch part 102 is provided for each output port serving as an output destination.

Each optical gate switch part 102 connects one by one with distribution paths from the 1:8 couplers 101 associated with the eight input ports #1 to #8, and an optical gate switch 102a is provided for each of the distribution paths. Based on a driving signal supplied from a driving circuit 105, the optical gate switch 102a is controlled for the passage/shutoff of an optical packet signal input thereto. For example, a SOA can be used as the optical gate switch 102a, but other optical elements such as an electro-absorption optical modulator may also be used. It should be noted that the optical packet switch (interconnect system) 100 may be contained in an enclosure.

The driving circuit 105 is provided for each optical gate switch 102a, and supplies, to the optical gate switch 102a, a driving signal responsive to a trigger signal input from a trigger signal output part (trigger signal generator) 106. It should be noted that in FIG. 1, attention is focused on the driving circuits 105 corresponding to the optical gate switches 102a in the optical gate switch part 102 associated with the output port #8.

The trigger signal output part 106 supplies, to the corresponding driving circuit 105, a trigger signal responsive to the control timing of conduction/shutoff for each optical gate switch 102a. Furthermore, the output timing of trigger signals output from the trigger signal output part 106 to the respective driving circuits 105 can be controlled by a synchronization part (synchronizer) 107.

The synchronization part 107 synchronizes the timing, at which this optical packet signal is fed to the optical gate switch 102a to be controlled for the conduction of an optical packet signal, and the timing, at which this optical packet signal passes therethrough, with the control for the conduction/shutoff of this optical gate switch 102a. For example, the trigger signal output part 106 is controlled so that the trigger signal, output from the trigger signal output part 106 for the conduction/shutoff control of the optical gate switch 102a, is substantially synchronized with the timing of input and passage of the optical packet signal.

It should be noted that the synchronization part 107 is capable of controlling the trigger signal output part 106 in a mode associated with a position at which the optical packet switch 100 is mounted, for example.

For example, when the optical packet switch 100 is applied to a relay position of the network, an optical transmission line is connected to each of the input and output ports #1 to #8. Further, the input of an optical packet signal to each of the input ports #1 to #8 is detected at a position upstream of the 1:8 coupler 101. Furthermore, the output of the trigger signal is controlled so that the optical gate switch 102a, determined in accordance with the output ports #1 to #8 to which the optical packet signal whose input is detected should be led, is brought into conduction before this optical packet signal reaches this optical gate switch 102a. Besides, the output of the trigger signal is controlled so that the optical gate switch 102a is shut off after this optical packet signal has passed therethrough.

Alternatively, when the optical packet switch 100 is applied to the position of a transmitter for transmitting an optical packet signal, an optical packet signal source or the like for generating an optical packet signal is connected to each of the input ports #1 to #8. In this case, information concerning the supply timing of data signal for generating an optical packet signal is received by the relevant optical packet signal source, and a trigger signal supplied to the optical gate switch 102a, which should serve as a derivation destination, is controlled so as to be substantially synchronized with the input timing of this packet signal.

It should be noted that even if the optical packet switch 100 is mounted on any position, a delay unit may be appropriately disposed on an optical path leading to the 1:8 coupler 101 from the position at which the input of an optical packet signal is detected, or the mounted position of the optical packet signal source for generating an optical packet signal. Thus, the control of the optical gate switch 102a can be completed before an optical packet signal is input to this optical gate switch 102a.

Hence, the optical gate switch 102a is turned ON only during a time period when an optical packet signal passes therethrough, and turned OFF during other time periods, thereby preventing crosstalk and/or noise light leakage. Path switching can be carried out, for example, by turning OFF (performing shutoff control of) the optical gate switch 102a associated with a path used prior to switching, and by turning ON the optical gate switch 102a associated with a path used subsequent to switching.

As described above, upon turning ON of the optical gate switch 102a located between the desired input and output ports and the associated downstream side SOA 104 (i.e., when these optical gate switch 102a and SOA 104 are controlled to allow the passage of an optical packet signal therethrough), the path of the optical packet signal can be set between these input and output ports. For example, when an optical packet signal is set between the input port #i and output port #j, the SOA 102a having a gate output of i-j in the diagram and the SOA 104 located downstream of this SOA 102a are controlled so that the optical packet signal passes therethrough (i.e., so that these SOA 102a and SOA 104 are turned ON).

Specifically, the optical packet signals passed through the optical gate switches 102a, which have been turned ON, are multiplexed by an 8:1 coupler 103 for each output port, and then output therefrom. It should be noted that the SOAs 104 are provided at outputs of the 8:1 couplers 103, for example, in order to compensate for optical loss at the 8:1 couplers 103, but may be omitted as deemed appropriate.

In FIG. 1, each output port is equipped with the SOA 104 for loss compensation, and therefore, the two SOAs 102a and 104 provided on the same path are turned ON or OFF simultaneously or substantially simultaneously. In this case, the shorter the time required for ON/OFF switching, the finer the granularity (i.e., the shorter the packet length) of an optical packet signal that can be processed. Moreover, the faster the switching from ON to OFF or from OFF to ON, the shorter the idle time (guard time) between optical packet signals can be.

Thus, in the optical packet switch 100 illustrated in FIG. 1, the 72 (8×8+8=72) SOAs 102a and 104 are used. In other words, the number of the applied SOAs 102a and 104, serving as switching elements, is larger than N×N switching elements where the number of ports is N (=8).

When switching has to be performed in the order of nanoseconds as in the distributing/merging type optical packet switch 100, the switching time is delayed, for example, to affect response characteristics if a difference in millimeters occurs in the lengths of wiring through which driving signals are supplied to a plurality of the SOAs 102a and 104 for performing optical gate switching.

In other words, the switching responses of the SOAs 102a and 104 might be delayed due to the influence of a time constant determined by capacitance components (parasitic capacitances) and/or resistance components of the SOAs 102a and 104 themselves, inductance (L) components of wiring between the driving circuit and SOAs, etc. More specifically, even if a driving waveform for optical conduction/shutoff for the SOA is input in the form of an ideal rectangular wave, the waveform of output light as a response signal might become blunt, which might delay the switching response.

The driving circuits for outputting driving signals to the respective SOAs 102a and 104 are located so as to be immediately adjacent to the associated SOAs 102a and 104, and are arranged so that the wiring lengths thereof are equal to each other, thus making it possible to expect a uniform improvement in the response characteristics for each of the SOAs 102a and 104. However, when there exist a large number of the SOAs 102a and 104 and a large number of the driving circuits thereof as in the case illustrated in FIG. 1, it is not easy to maintain the uniform distances of the respective wiring lengths. Therefore, the response characteristics for the respective SOAs 102a and 104 are substantially different because the respective wiring lengths are different and have individual differences in parasitic capacitances.

A technique such as preemphasis is known as a technique in which the rising edge of a driving signal is lifted (i.e., the speed of a rising response is increased) using a circuit part, a CR circuit or the like, thereby sharpening the bluntness of the rising edge of rectangular wave of a response signal. It can also be assumed that the response characteristics of the foregoing SOAs 102a and 104 are enhanced using such a preemphasis technique; however, in order to improve the characteristics of the SOAs 102a and 104, it is necessary to individually adjust the amounts of preemphasis that should be given. In the illustrated optical packet switch 100, the individual adjustments of as many as 72 SOAs 102a and 104 serving as switching elements will be needed.

In order to adjust the amounts of preemphasis, it is necessary to adjust element characteristics that provide a circuit having the function of starting the rectangular wave edge of a driving waveform. Furthermore, considering that even if driving waveforms are individually adjusted, the characteristics of the SOAs serving as switching elements are changed with time and/or characteristic changes occur due to moisture absorption or the like of a driving circuit substrate, subsequent adjustment operations will be indispensable. Also for the sake of increasing the efficiency of maintenance and manufacturing process, the burden of the above-described individual adjustments is preferably alleviated as much as possible.

Figure 2:
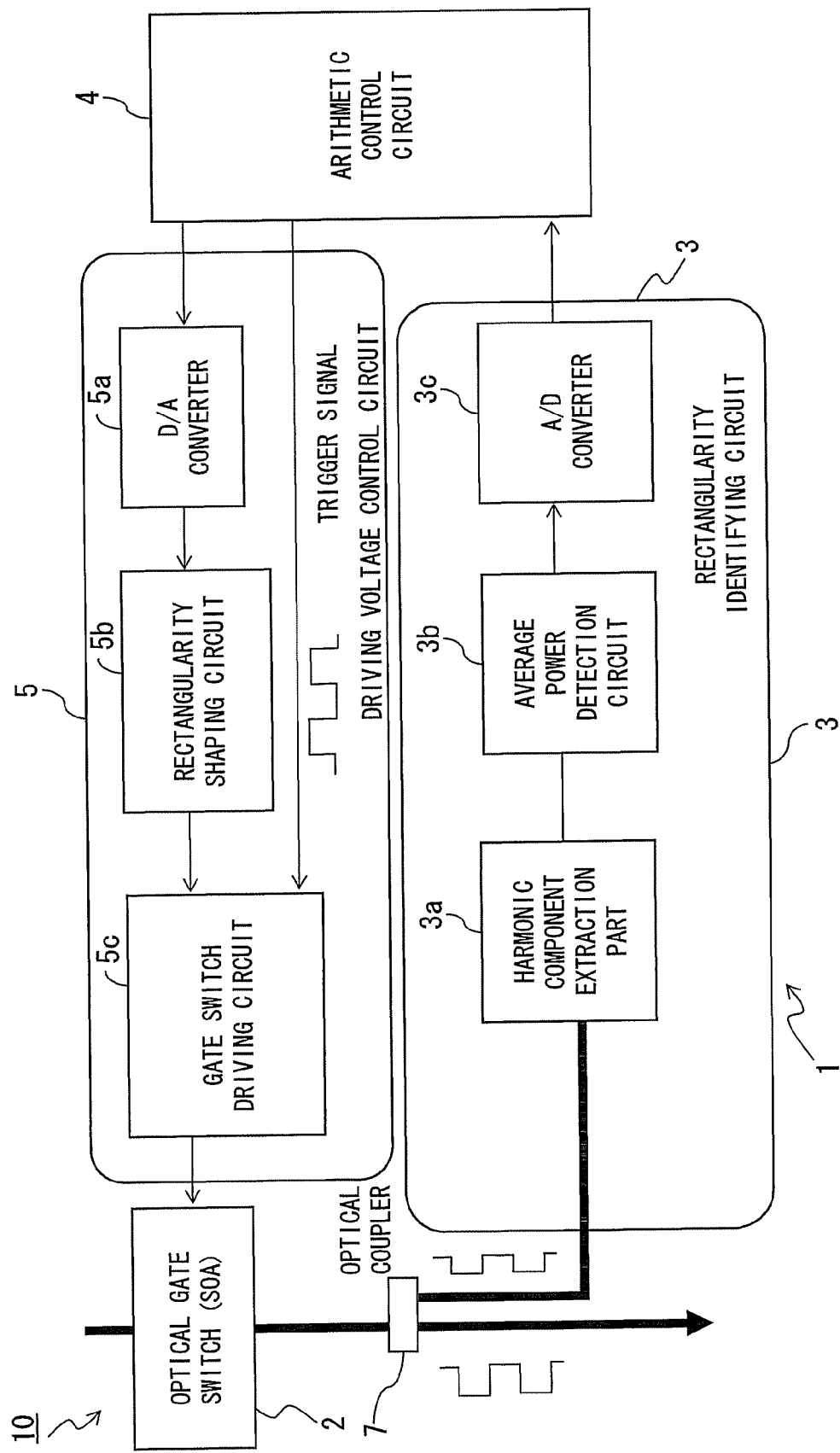
FIG. 2 illustrates a first embodiment.

Therefore, in the first embodiment, a waveform controller 1 and a responsive element module 10 illustrated in FIG. 2 are proposed. The waveform controller 1 monitors the rectangularity of an optical pulse that provides a response output in response to a driving signal supplied to a SOA 2 serving as a responsive element, and controls the driving waveform of the driving signal in accordance with the rectangularity of the monitoring result, thereby freely controlling the rectangularity of the optical pulse.

That is to say, the waveform controller 1 illustrated in FIG. 2 is applied to drive each of the foregoing SOAs 102a and 104 illustrated in FIG. 1, thereby allowing the rectangularity of an optical pulse, which provides a response output of each of the SOAs 102a and 104, to be shaped so that the target shape is obtained.

It should be noted that when the SOA 2 is applied as a component (denoted by the reference character 102a or 104) in the optical packet switch 100 illustrated in FIG. 1, the period of an optical pulse output from the SOA 2 has to be known in the waveform controller 1 for the control of rectangularity. Therefore, prior to the start of operation of the optical packet switch 100 (i.e., when input light to the SOA 2 is in a non-input state), the shaping of rectangularity of an optical pulse can be carried out by the waveform controller 1.

Furthermore, the responsive element module 10 includes the foregoing waveform controller 1 and at least one SOA 2 serving as a responsive element. In one example of the embodiment (which will be hereinafter called "one example"), the waveform controller 1 illustrated in FIG. 2 includes: a rectangularity identifying circuit 3; an arithmetic control circuit 4; and a driving voltage control circuit 5. The arithmetic control circuit 4 serves as one example of the foregoing trigger signal output part 106 illustrated in FIG. 1. Specifically, in synchronization with the timing at which an optical packet serving as input light is input to the operated SOA 2 (see 102a or 104 in FIG. 1), a trigger signal for allowing the conduction of the input light to this SOA 2 can be supplied via the driving voltage control circuit 5 in which the shaping of rectangularity described below is carried out.

In the waveform controller 1, when the shaping of rectangularity of an output optical pulse is carried out, amplified spontaneous emission light (ASE light) obtained by driving the SOA 2 with a constant periodic trigger signal is used for the SOA 2 during non-operating time. That is, when the constant ON/OFF periodic driving signal generated by the arithmetic control circuit 4 is supplied via the driving voltage control circuit 5 to the SOA 2 to which no input light is input, amplified spontaneous emission light (ASE light) is output as a response output from this SOA 2.

At this point, the ASE light has an optical pulse intensity variation responsive to the ON/OFF of the driving signal. Specifically, upon turning ON of the driving signal, the ASE light is output, which thus corresponds to the ON state of the optical pulse; on the other hand, upon turning OFF of the driving signal, the output light level of the ASE light becomes 0, which thus corresponds to the OFF state of the optical pulse.

The rectangularity identifying circuit 3 serves as one example of a monitor for monitoring the waveform of an output pulse obtained by the response of the SOA 2, which is a responsive element, to the driving signal supplied thereto from the driving voltage control circuit 5 described later. The rectangularity identifying circuit 3 identifies the rectangularity of waveform of the output optical pulse from the SOA 2, for example, by numerically expressing the extent to which the waveform of the output optical pulse is close to a true (ideal) rectangular shape. In one example, the rectangularity identifying circuit 3 includes: a harmonic component extraction part (harmonic component extractor) 3a; an average power detection circuit 3b; and an analog/digital (ND) converter 3c.

Figure 3A:
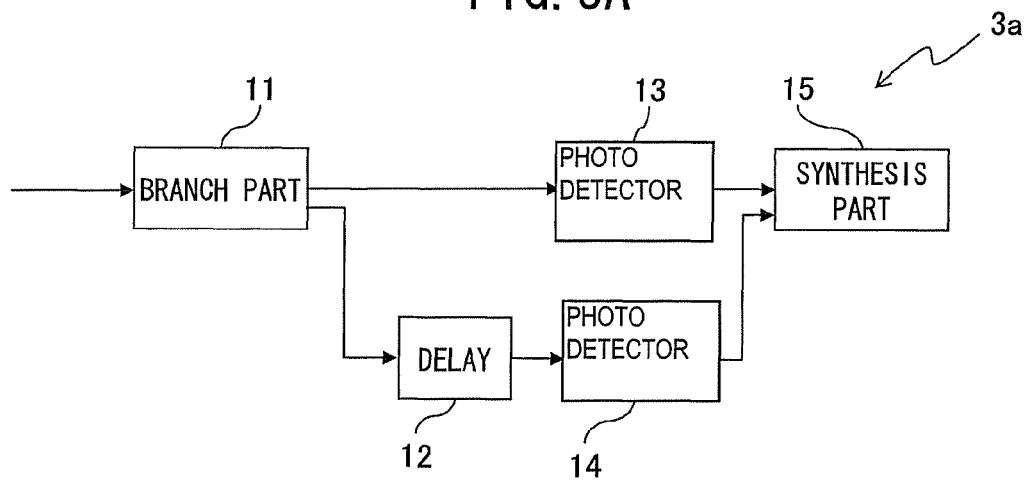
FIGS. 3A to 3C each illustrate a harmonic component extraction part according to the first embodiment.

The harmonic component extraction part 3a extracts an even-order or odd-order harmonic component for the frequency (known) of a trigger pulse, which provides a driving signal and is contained in the output pulse (output optical pulse) from the SOA 2. When the harmonic component extraction part 3a extracts an even-order harmonic component of the trigger pulse, the harmonic component extraction part 3a includes, in one example, a branch part (splitter) 11, a delay part (delay element) 12, light-receiving parts (photo detector) 13 and 14, and a synthesis part 15 as illustrated in FIG. 3A.

A 3 dB coupler or the like is applied to the branch part 11. The branch part 11 receives part of the output optical pulse output from the SOA 2 through an optical branch part (splitter) 7 including an optical coupler or the like, and branches the received output optical pulse into two parts. Then, one of the two parts branched by the branch part 11 is connected to the light-receiving part 13, while the other part is connected to the light-receiving part 14 via the delay part 12.

For example, a delay line (optical fiber) interposed between the branch part 11 and the light-receiving part 14 is applied to the delay part 12. The delay part 12 delays, for a given period of time, the light input to the light-receiving part 14 with respect to the light input to the light-receiving part 13 from the branch part 11. This delay time is equivalent to a half of the pulse period of an output pulse from the SOA 2 (or the period of a pulse signal that provides a driving signal output from the driving voltage control circuit 5 to the SOA 2), for example.

Both of the light-receiving parts 13 and 14 each convert the input light into an electric signal (i.e., perform photoelectric conversion on the input light), and a photodiode (PD), for example, is applied to each of the light-receiving parts 13 and 14. Specifically, the electric signals output from the light-receiving parts 13 and 14 are electric pulse signals each having an amplitude change equivalent to an output optical pulse output from the SOA 2. It is to be noted that the electric pulse signal, sent from the light-receiving part 14 receiving the light delayed by the delay part 12, is delayed with respect to the electric pulse signal from the light-receiving part 13 by a half period time of the pulse period of this electric pulse signal.

The synthesis part 15 synthesizes, i.e., superposes, the electric pulse signals output from the foregoing light-receiving parts 13 and 14. In the synthesis part 15, the electric pulse signals having a relative delay time difference corresponding to the half period time of the pulse period are superposed, thereby mutually canceling out the odd-order harmonic component deviated by a half-wavelength with respect to the pulse period. As a result, only the even-order harmonic component will remain in the signal that has been synthesized by the synthesis part 15. Thus, the harmonic component extraction part 3a can output the even-order harmonic component.

Now, Eq. (1) is one example of a Fourier series equation for an instantaneous value v(t) where a non-sinusoidal wave AC time is t. Further, in one example, an ideal rectangular wave v(t) can be derived as in the Fourier series expansion of Eq. (2) from Eq. (1). In this case, in Eq. (1) and Eq. (2), V represents an amplitude, ω represents an angular velocity, and T represents a period, and then the following equation is obtained: ω=2π/T. It should be noted that the rectangular wave v(t) presented in Eq. (2) is v(t)=V where −T/4<t<T/4, and is v(t)=−V where T/2<t<−T/4, T/4<t<T/2.

$$v(t) = b_0 + \sum_{n=1}^{\infty} A_n \sin(n\omega t + \theta_n) \quad (1)$$

$$\left( \text{where } A_n = \sqrt{a_n^2 + b_n^2}, \theta_n = \tan^{-1}(b_n/a_n), \right.$$

$$\left. b_0 = \frac{1}{T} \int_0^T v(t) dt, a_n = \frac{2}{T} \int_0^T v(t) \sin n\omega t \, dt, b_n = \frac{2}{T} \int_0^T v(t) \cos n\omega t \, dt \right)$$

$$v(t) = \frac{4V}{\pi} \left( \cos\omega t - \frac{1}{3}\cos 3\omega t + \frac{1}{5}\cos 5\omega t - \frac{1}{7}\cos 7\omega t + \ldots \right) \quad (2)$$

An ideal rectangular wave includes superposition of odd-order harmonic components of a pulse period that provides a pulse signal. That is, the component ωt presented in Eq. (2) is a first-order wave, and the components 3ωt, 5ωt and 7ωt presented in Eq. (2) are third-order, fifth-order and seventh-order harmonics, respectively. As illustrated in Eq. (2), in an ideal rectangular wave, the even-order harmonic component (component of n=2, 4, . . . ) in Eq. (1) will be 0.

Accordingly, it can be said that the even-order harmonic components extracted in the foregoing harmonic component extraction part 3a (e.g., the components 2ωt, 4ωt in the Fourier series expansion in Eq. (1)) are elements that substantially deform the pulse signal waveform from an ideal rectangular wave shape.

FIG. 4 is a diagram illustrating one example of a spectrum characteristic (A) included in the pulse signal input to the rectangularity identifying circuit 3 from the optical branch part (splitter) 7, and illustrating one example of a transmission characteristic (B) for the foregoing harmonic component extraction part 3a. As illustrated in FIG. 4, the pulse signal input to the rectangularity identifying circuit 3 includes: odd-order harmonic components A1, A3, A5, . . . as those illustrated in Eq. (1) described above; and even-order harmonic components A2, A4, A6, . . . , which are components for deforming an ideal rectangular waveform shape. It should be noted that in FIG. 4, the numerals attached to "A" indicate the order of a harmonic component. Furthermore, in FIG. 4, the horizontal axis represents frequency, and the longitudinal axis represents amplitude (instantaneous value voltage).

For example, in FIG. 4, the harmonic component extraction part 3a has a transmission frequency band as indicated by the shaded region B. In other words, the harmonic component extraction part 3a can exhibit characteristics of a comb filter in which the transmission frequency band (B) and cutoff frequency band are alternately arranged. Thus, the foregoing even-order harmonic components A2, A4, A6, . . . can be transmitted, while the odd-order harmonic components A1, A3, A5, . . . can be cut off.

FIGS. 5A to 5E each illustrate one example of a simulation result of a pulse signal waveform obtained when the factor of the even-order harmonic component in Eq. (1), for example, is changed, thus changing the proportion of the contained even-order harmonic components to the odd-order harmonic components of the pulse period.

Figure 5A:
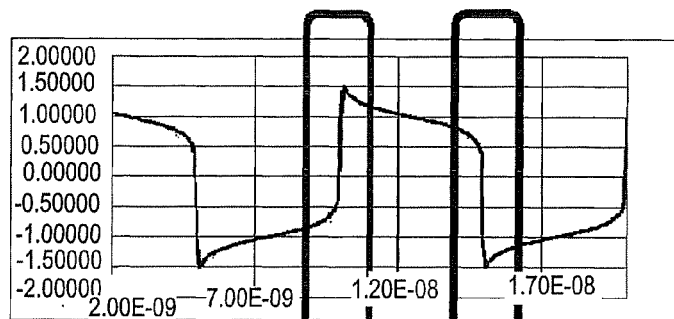
FIGS. 5A to 5E illustrate operational functions of the harmonic component extraction part according to the first embodiment.
Figure 5B:
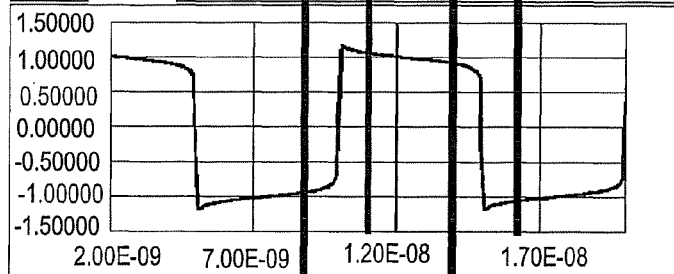
Figure 5C:
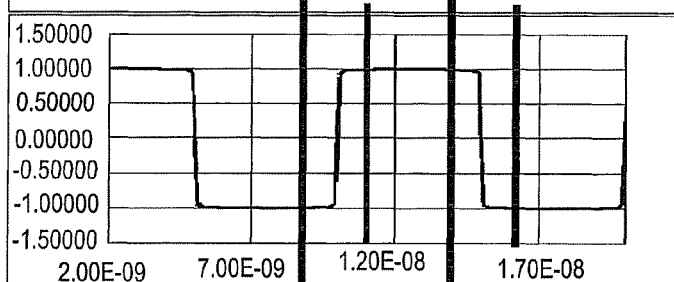

Now, FIG. 5C illustrates one example of a simulation result obtained when the odd-order harmonic components of the harmonic components of the 1st to 199th order are superposed, except the even-order harmonic components. Further, FIG. 5A illustrates one example of a simulation result obtained when the superposition of the odd-order harmonic components of the harmonic components of the 1st to 199th order, and the even-order harmonic components of a first proportion are superposed in the same phase. Furthermore, FIG. 5B illustrates one example of a simulation result obtained when the superposition of the odd-order harmonic components, and the even-order harmonic components of a second proportion smaller than the first proportion are superposed in the same phase.

Figure 5D:
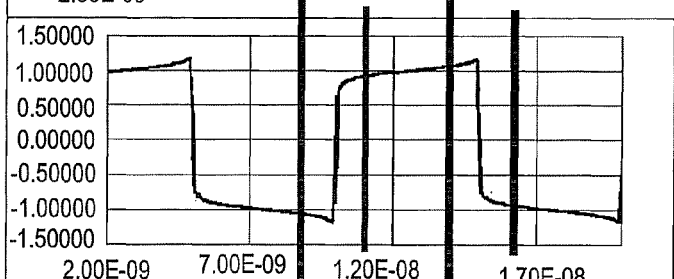
Figure 5E:
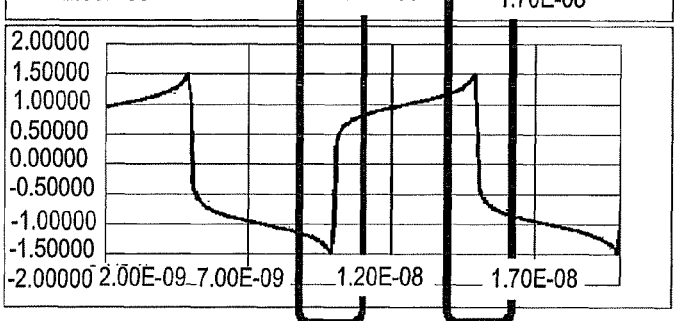

On the other hand, FIG. 5D illustrates one example of a simulation result obtained when the even-order harmonic components of the foregoing second proportion are superposed with the odd-order harmonic components in the phase opposite to that of the odd-order harmonic components. Furthermore, FIG. 5E illustrates one example of a simulation result obtained when the even-order harmonic components of the foregoing first proportion are superposed with the odd-order harmonic components in the phase opposite to that of the odd-order harmonic components.

Specifically, in the case of the superposition of the odd-order harmonic components of a pulse period that provides a pulse signal, an approximately ideal rectangular wave shape is obtained as indicated by the simulation result of FIG. 5C. On the other hand, as the proportion of the contained even-order harmonic components is increased, the extent to which the pulse signal waveform is deformed from an ideal rectangular wave shape is increased as illustrated in FIGS. 5A, 5B, 5D and 5E.

The average power detection circuit 3b, which is a component of the rectangularity identifying circuit 3, is one example of a power monitor for monitoring the power of the even-order or odd-order harmonic components extracted by the harmonic component extraction part 3a. The average power detection circuit 3b in the first embodiment detects the power (average power) of the even-order harmonic components extracted by the harmonic component extraction part 3a. The A/D converter 3c coverts the value of the average power, detected by the average power detection circuit 3b, from an analog signal into a digital signal, and outputs the converted signal to the arithmetic control circuit 4.

Thus, the rectangularity identifying circuit 3 outputs, as a monitoring result, the magnitude of the even-order harmonic components, which are elements for deforming the output optical pulse from an ideal rectangular wave shape. In this case, when the power of the even-order harmonic components contained in the output optical pulse is at the minimum level, an approximately ideal rectangular wave shape can be obtained as the waveform of the output optical pulse.

Figure 3B:
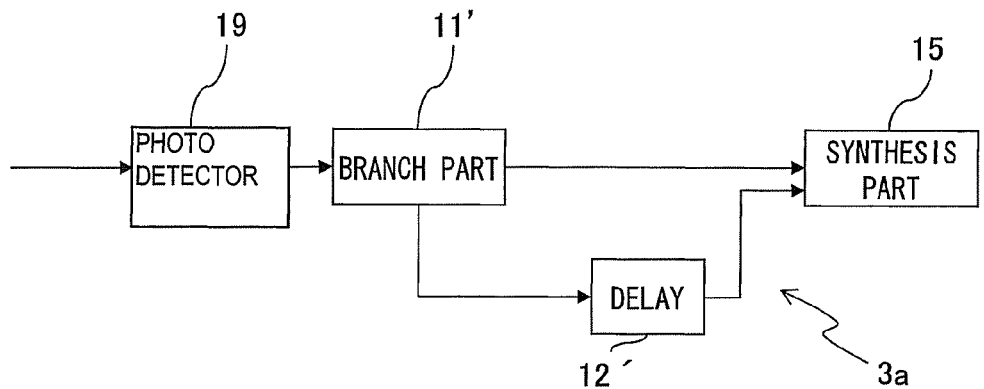

It should be noted that in FIG. 3A described above, the light-receiving parts 13 and 14 for performing photoelectric conversion on the branched lights are provided at subsequent stages of the optical branching in the branch part 11. In another example, a light-receiving part (photo detector) 19 may be provided at a preceding stage of the function of a branch part 11' as illustrated in FIG. 3B, for example. In this case, the branch part 11' branches an electric pulse signal from the light-receiving part (photo detector) 19 into two signals, and a delay part 12' gives a delay time difference equivalent to the foregoing case to the electric pulse signal from the branch part 11'. Thus, the synthesis part 15 can output the even-order harmonic component similar to that in the case of FIG. 3A.

In addition, when pulse signals having the delay time difference therebetween as illustrated in FIGS. 3A and 3B are superposed in the synthesis part 15, an amplifier or the like may be disposed as appropriate at the input side of the synthesis part 15 with the aim of matching the levels of the respective input pulse signals with each other.

Moreover, the harmonic component extraction part 3a may extract odd-order harmonic components, and the rectangularity identifying circuit 3 may output, as a monitoring result, the power information (digital signal) of the extracted odd-order harmonic components. In this case, the harmonic component extraction part 3a has the characteristics of a comb filter, which allow the passage of the odd-order harmonic components A1, A3, A5, ... illustrated in FIG. 4 described above, but cut off the even-order harmonic components A2, A4, .... The odd-order harmonic components are elements for forming an ideal rectangular shape in the output pulse. Accordingly, if the power of the odd-order harmonic components detected by the average power detection circuit 3b is maximized, an approximately ideal rectangular wave shape can be obtained as the waveform of the output optical pulse.

Figure 3C:
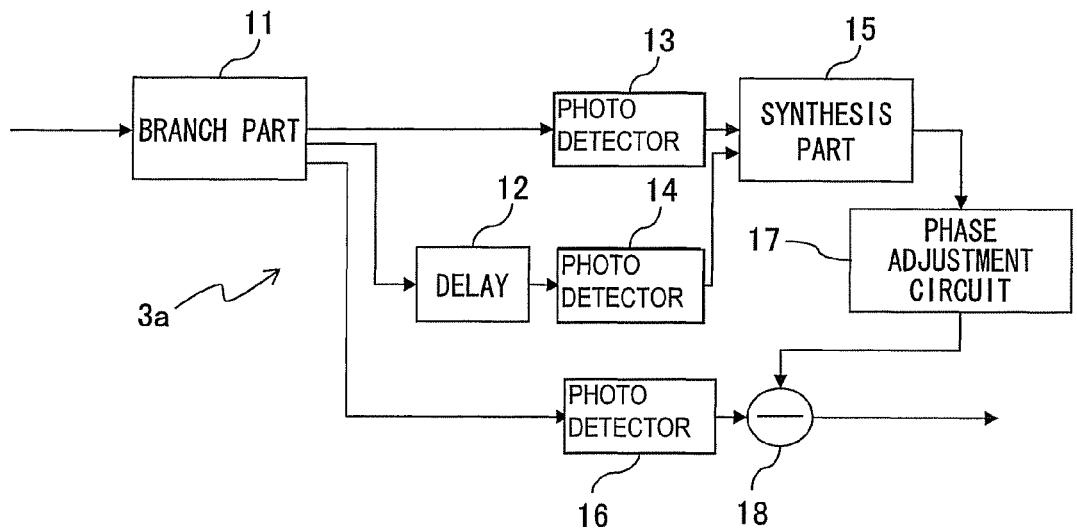

FIG. 3C illustrates one example of the harmonic component extraction part 3a for extracting an odd-order harmonic component of a trigger pulse. The harmonic component extraction part 3a illustrated in FIG. 3C includes: a branch part 11; a delay part 12; light-receiving parts 13 and 14; a synthesis part 15; a light-receiving part (photo detector) 16; a phase adjustment circuit (phase adjuster) 17; and a subtraction part (subtracter) 18.

The branch part 11 illustrated in FIG. 3C differs from that illustrated in FIG. 3A described above in that the branch part 11 of FIG. 3C branches the power of the output optical pulse received through the optical branch part 7 into three equal parts, and leads them to the three light-receiving parts (photo detector) 13, 14 and 16. The delay part 12, the light-receiving parts 13 and 14, and the synthesis part 15 are basically similar to those illustrated in FIG. 3A described above. That is, an even-order harmonic component of the output optical pulse can be output from the synthesis part 15.

Further, the light-receiving part 16 converts (performs photoelectric conversion on) the input light, i.e., one of the three equal parts of the output optical pulse divided by the branch part 11, into an electric signal, and outputs the electric signal to the subtraction part 18. The phase adjustment circuit 17 performs phase adjustment on the signal of the even-order harmonic component from the synthesis part 15, thereby matching the phase of this signal to that of the even-order harmonic component contained in the electric pulse signal input to the subtraction part 18 from the light-receiving part 16.

Besides, the subtraction part 18 subtracts, from the electric pulse signal supplied from the light-receiving part 16, the even-order harmonic component supplied from the synthesis part 15, thereby extracting the odd-order harmonic component that is the remaining component after the subtraction. Thus, the harmonic component extraction part 3a illustrated in FIG. 3C can extract the odd-order harmonic component of the trigger pulse.

It should be noted that three branch routes of a branch element having four branch routes may be applied to the three branch routes of the branch part 11 illustrated in FIG. 3C described above. Further, an amplifier and/or an attenuator for adjusting the amplitudes of the electric signals output from the light-receiving parts 13, 14 and 16 may be used as appropriate, thus enabling the matching of the amplitudes of the respective electric signals output from the light-receiving parts 13, 14 and 16.

Furthermore, the arithmetic control circuit 4 and the driving voltage control circuit 5 are operated in cooperation with each other, and are thus equivalent to one example of a driving waveform shaping part for shaping the waveform of a driving signal based on a monitoring result obtained by the monitor 3. That is, the arithmetic control circuit 4 and the driving voltage control circuit 5 serve as the driving waveform shaping parts 4 and 5 to shape the waveform of a driving pulse signal so that the power monitored by the rectangularity identifying circuit 3 attains a given level or falls within a given range.

For example, when the power of an even-order harmonic component is output as a monitoring result from the average power detection circuit 3b, the waveform of the driving pulse signal is shaped with the control objective of minimizing the monitored power. Furthermore, when the power of an odd-order harmonic component is output as a monitoring result from the average power detection circuit 3b, the waveform of the driving pulse signal is shaped with the control objective of maximizing the monitored power.

In this embodiment, the arithmetic control circuit 4 supplies a trigger signal for gate ON/OFF to a gate switch driving circuit 5c including a digital computing element, for example, and serving as a component of the driving voltage control circuit 5. Furthermore, based on a monitoring result input as a digital signal from the rectangularity identifying circuit 3, the arithmetic control circuit 4 outputs, as a digital signal, a control signal for controlling the waveform of an optical pulse in the SOA 2.

Based on a pulse signal for gate ON/OFF supplied from the arithmetic control circuit 4, the driving voltage control circuit 5 generates a driving pulse signal, and supplies the generated driving pulse signal to the SOA 2. At this point, in the driving voltage control circuit 5, the waveform of the driving pulse signal to be output is shaped based on the control signal for controlling the optical pulse waveform output from the SOA 2.

In one example, the driving voltage control circuit 5 includes a D/A converter 5a, a rectangularity shaping circuit 5b, and the gate switch driving circuit 5c, which are illustrated in FIG. 2.

The D/A converter 5a converts the control signal, input thereto as a digital signal from the arithmetic control circuit 4, into an analog signal. The rectangularity shaping circuit 5b generates, based on the control signal supplied from the D/A converter 5a, a control signal supplied to a variable capacitance element 16a (see FIG. 6) serving as a component of the gate switch driving circuit 5c.

Based on the trigger signal for gate ON/OFF from the arithmetic control circuit 4, the gate switch driving circuit 5c generates the driving pulse signal (driving signal), and the waveform of the driving pulse signal generated at this time is shaped based on the control signal supplied from the rectangularity shaping circuit 5b. In other words, the gate switch driving circuit 5c is one example of a driving circuit part for shaping, based on the control signal, the waveform of the driving signal supplied to the SOA 2 serving as a responsive element; furthermore, the arithmetic control circuit 4 is one example of a control part for outputting the control signal to the driving circuit part 5c (via the rectangularity shaping circuit 5b) based on the monitoring result obtained by the monitor 3.

FIG. 6 illustrates one example of the gate switch driving circuit 5c. The gate switch driving circuit 5c illustrated in FIG. 6 includes: a circuit part 16 including the variable capacitance element 16a and resistors 16b and 16c; and a driver amplifier (Driver AMP) 17. In this example, a trigger signal supplied from the arithmetic control circuit 4 is amplified by the driver amplifier 17 via the circuit part 16, and is output as a driving pulse signal to the SOA 2.

The variable capacitance element 16a, which constitutes the circuit part 16, is an element whose capacitance is variable depending on the value of the control signal from the rectangularity shaping circuit 5b. A varicap is one example of the variable capacitance element 16a. In this case, a varicap voltage control circuit for allowing a voltage (varicap voltage), which should be applied as a control signal to the varicap 16a, to be variable in accordance with the control signal from the arithmetic control circuit 4 is one example of the rectangularity shaping circuit 5b.

When the capacitance of the variable capacitance element 16a is made variable through the control signal from the rectangularity shaping circuit 5b, the response time constant of the circuit part 16 can be varied, thus shaping the waveforms of rising and falling edges of the driving pulse signal supplied from the gate switch driving circuit 5c. If the capacitance of the variable capacitance element 16a is defined as a capacitance C12 and the resistance values of the resistors 16b and 16c are defined as fixed values R21 and R23, respectively, a response time constant τ1 of the circuit part 16 is expressed by the following Eq. (3). Accordingly, when the capacitance C12 is increased, the response time constant τ1 is increased, and when the capacitance C12 is decreased, the response time constant τ1 is decreased.

$$\tau_1 = \frac{C_{12} \cdot R_{21} \cdot R_{23}}{R_{21} + R_{23}} \quad (3)$$

In the variable capacitance element 16a serving as a varicap, for example, the capacitance C12 and the control voltage signal from the rectangularity shaping circuit 5b can have the following relationship: when the control voltage signal from the rectangularity shaping circuit 5b is decreased, the capacitance C12 is increased, and when the control voltage signal from the rectangularity shaping circuit 5b is increased, the capacitance C12 is decreased. Thus, the response time constant of the circuit part 16, which constitutes the gate switch driving circuit 5c, can be made variable through the control voltage signal generated from the control signal supplied from the arithmetic control circuit 4. In other words, the arithmetic control circuit 4 controls the response time constant of the circuit part 16 through the control of the capacitance of the variable capacitance element 16a, thereby making it possible to control the waveform of the driving pulse signal output from the gate switch driving circuit 5c.

Figure 7A:
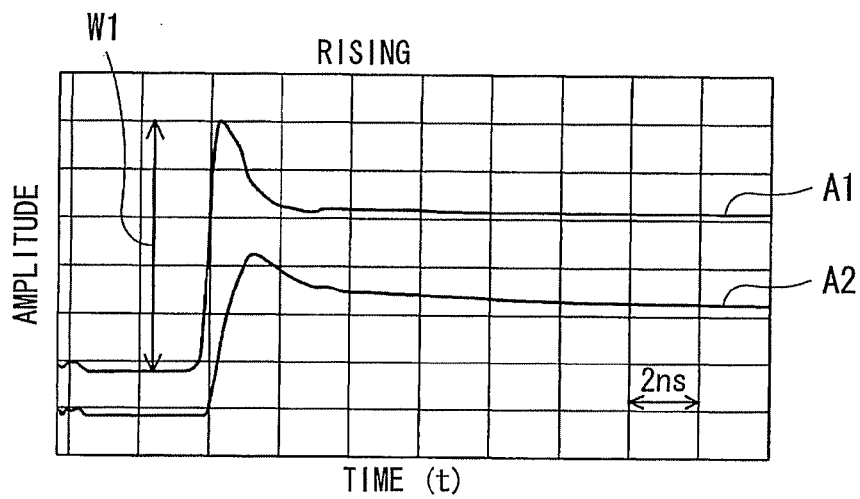
FIGS. 7A to 7C each illustrate, by way of example, rising waveforms of a driving pulse signal and an optical pulse, which are responsive to the magnitude of capacitance of a variable capacitance element.
Figure 7B:
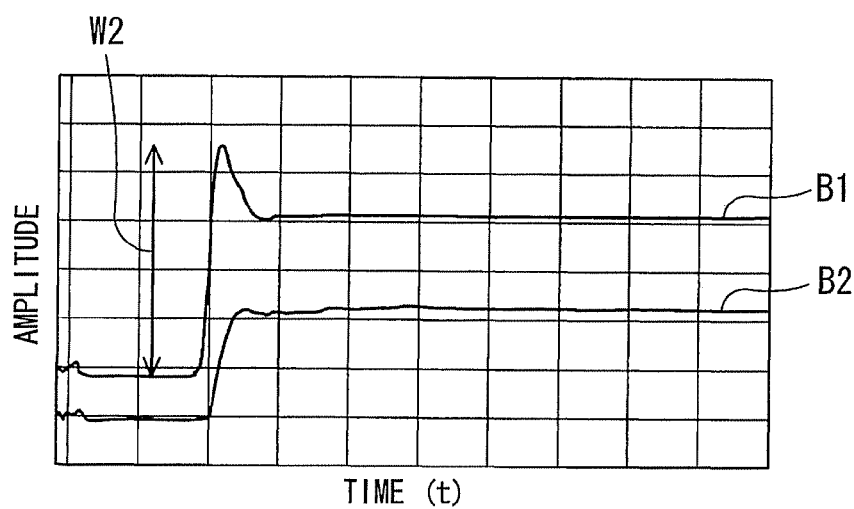
Figure 7C:
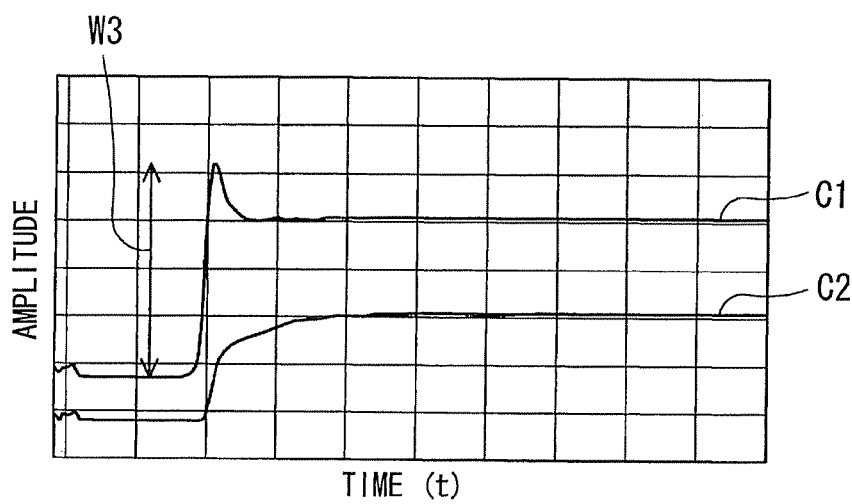

FIGS. 7A to 7C are diagrams each illustrating, by way of example, rising waveforms of a driving pulse signal and an optical pulse, which are responsive to the magnitude of capacitance of the variable capacitance element 16a (or the magnitude of a control voltage signal (applied voltage)). FIG. 7A illustrates a case where the value of the control voltage signal is relatively decreased, and the capacitance C12 is relatively increased. FIG. 7C illustrates a case where the control voltage signal is relatively increased, and the capacitance C12 is relatively decreased. And FIG. 7B illustrates a case where the control voltage signal and the capacitance C12 are set at values between those in FIG. 7A and those in FIG. 7C.

Specifically, as illustrated in FIG. 7A, the response time constant is increased upon increase of the capacitance C12. Therefore, a driving pulse signal A1 from the gate switch driving circuit 5c sharply rises, and its transient rising width W1 is large; in addition, the time required for the driving pulse signal A1 to settle at a constant value becomes relatively long. Moreover, since the SOA 2 is driven by the driving pulse signal A1, the rising width of which is increased in this manner, the rising width of an optical pulse A2 to be output is also increased.

On the other hand, as illustrated in FIG. 7C, the response time constant is decreased upon decrease of the capacitance C12. Therefore, a driving pulse signal C1 from the gate switch driving circuit 5c bluntly rises, and its transient rising width W3 is small; in addition, the time required for the driving pulse signal C1 to settle at a constant value becomes relatively short. Moreover, since the SOA 2 is driven by the driving pulse signal C1, the rising edge of which is made blunt in this manner, the rising edge of an optical pulse C2 to be output is also blunt.

In FIG. 7B, the control voltage signal and the capacitance C12 are set at values between those in FIG. 7A and those in FIG. 7C. In this case, the rising characteristic of a driving pulse signal B1 has sharpness between that of the rising characteristic of the foregoing signal A1 and that of the rising characteristic of the foregoing signal C1, the value of a transient rising width W2 of the driving pulse signal B1 is between that of the rising width W1 and that of the rising width W3, and the time required for the driving pulse signal B1 to settle at a constant value is also between the required time in FIG. 7A and the required time in FIG. 7C. It should be noted that in the optical pulse from the SOA 2 driven by this driving pulse signal B1, the rising edge close to a true (ideal) rectangular wave shape is obtained.

Figure 8A:
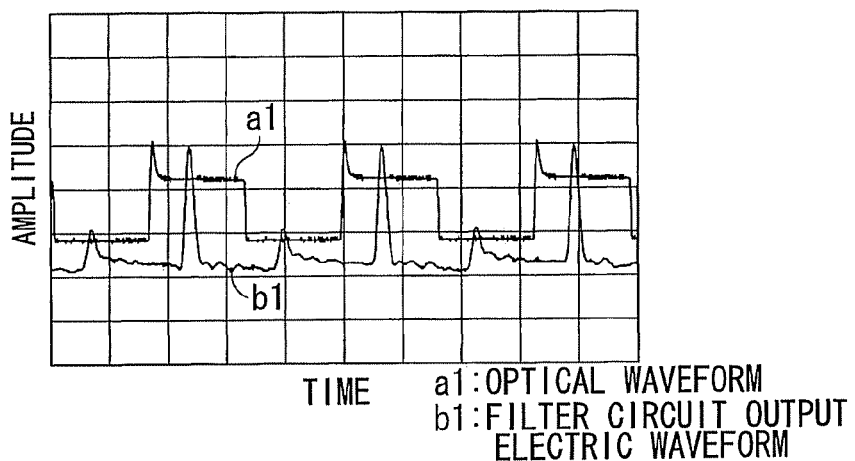
FIGS. 8A to 8C each illustrate, by way of example, a signal waveform of an even-order harmonic component, and a waveform of an optical pulse, which are responsive to the value of a control voltage signal supplied to the variable capacitance element.
Figure 8B:
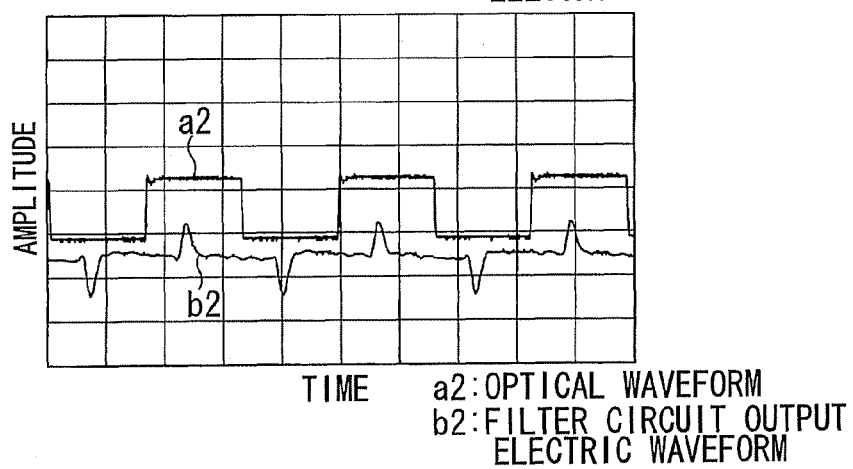
Figure 8C:
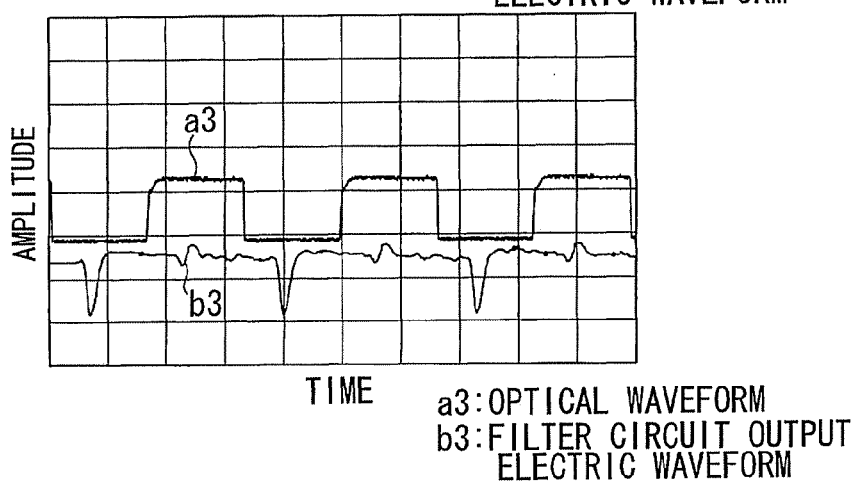

Based on the optical pulse waveform monitoring result from the rectangularity identifying circuit 3, the arithmetic control circuit 4 controls the optical pulse waveform output from the SOA 2 by means of feedback control through the rectangularity shaping circuit 5b and the gate switch driving circuit 5c. FIGS. 8A to 8C each illustrate, by way of example, a signal waveform of an even-order harmonic component extracted by the harmonic component extraction part 3a, and a waveform of an optical pulse output from the SOA 2, which are responsive to the value of a control voltage signal supplied to the foregoing variable capacitance element 16a (or the capacitance C12 at this time).

As illustrated in FIG. 8A, when an optical pulse a1 steeply rises, a signal b1 of the even-order harmonic component extracted by the harmonic component extraction part 3a also includes a position at which the amplitude thereof is relatively large. Furthermore, as illustrated in FIG. 8C, also when the rising edge of an optical pulse a3 is blunt, a signal b3 of the even-order harmonic component extracted by the harmonic component extraction part 3a also includes a position at which the amplitude thereof is relatively large. Therefore, in both the cases of FIGS. 8A and 8C, the power of the even-order harmonic component detected by the power detection circuit 3b is relatively large.

On the other hand, as illustrated in FIG. 8B, when an optical pulse a2 has a waveform close to a true (ideal) rectangular wave shape, the amplitude of an even-order harmonic component b2 extracted by the harmonic component extraction part 3a is relatively small. The power of the even-order harmonic component detected by the power detection circuit 3b in this case will be smaller as compared with the foregoing cases of FIGS. 8A and 8C.

Accordingly, in one example, the arithmetic control circuit 4 outputs a control signal to the rectangularity shaping circuit 5b so that the power of the even-order harmonic component, which is a monitoring result from the rectangularity identifying circuit 3, is minimized or falls within the minimum range including a certain error. Thus, the waveform of an output optical pulse can be maintained to be a waveform B2 of FIG. 7B, for example. This is because when the even-order harmonic component contained in the output optical pulse is minimized as explained above, the waveform of the optical pulse substantially has an ideal rectangular wave shape, which is superposition of odd-order harmonic components.

As explained above, the capacitance of the variable capacitance element 16a is controlled in the arithmetic control circuit 4 via the rectangularity shaping circuit 5b based on the even-order harmonic component power from the rectangularity identifying circuit 3, thereby allowing the waveform of the optical pulse output from the SOA 2 to maintain a given waveform. It should be noted that the arithmetic control circuit 4 is capable of storing the control amount of a control signal (e.g., a control signal supplied to the rectangularity shaping circuit 5b) when the given waveform can be maintained. Thus, when the SOA 2 is actually operated as a gate switch, the output optical waveform can be shaped into the desired waveform even if no feedback control is carried out.

Further, the aim of control of the waveform of an optical pulse may be to provide a true rectangular wave shape like the one illustrated above, a waveform having a rectangularity with a large rising width like the optical pulse A2 in FIG. 7A, or a waveform having a rectangularity with a blunt rising edge like the optical pulse C2 in FIG. 7C.

Figure 9:
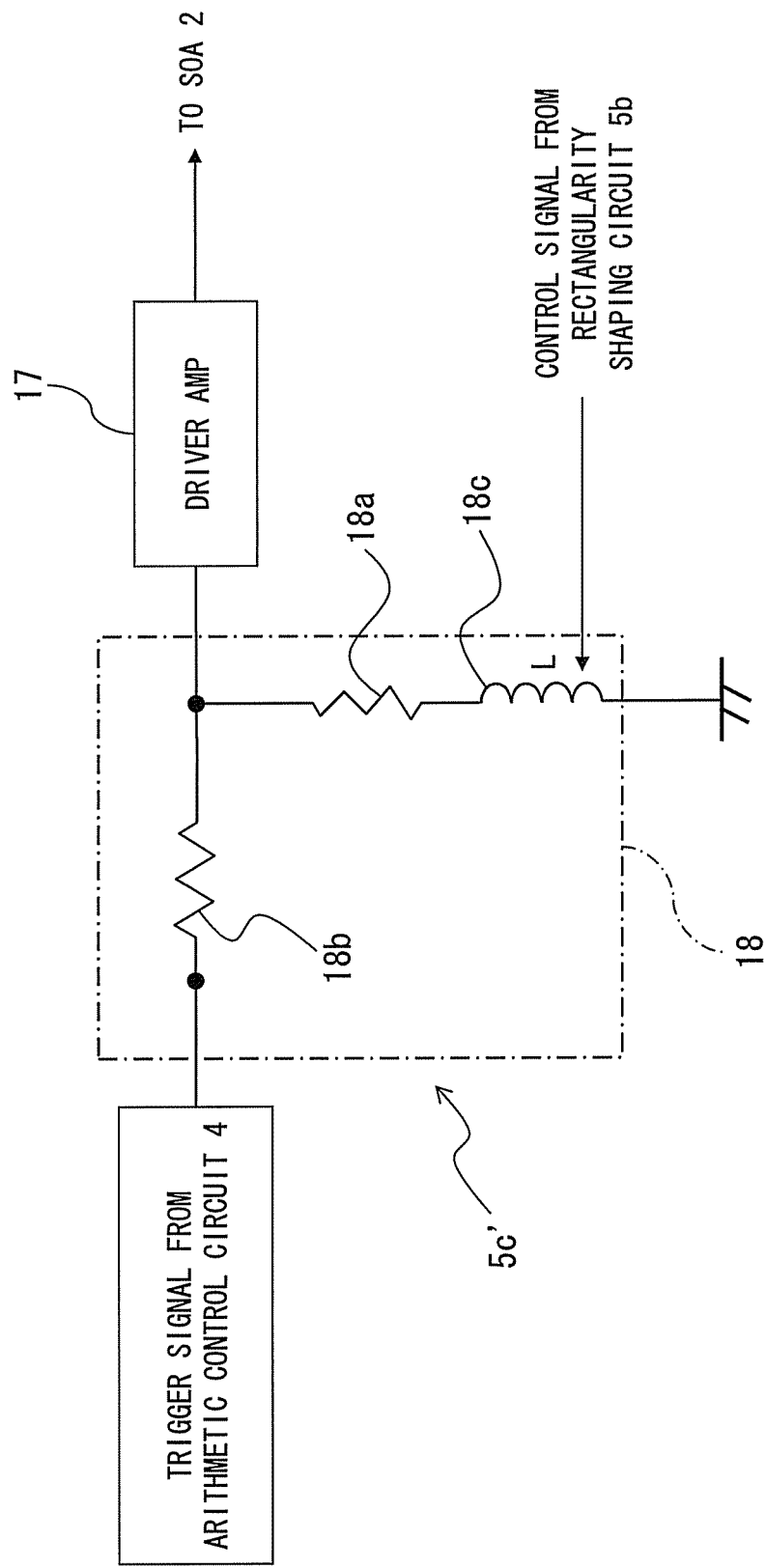
FIG. 9 illustrates one example of a gate switch driving circuit.

FIG. 9 is a diagram illustrating a gate switch driving circuit 5c', which is a variation of the gate switch driving circuit 5c illustrated in FIG. 6. The gate switch driving circuit 5c' is another example of a driving circuit part for shaping, based on a control signal, the waveform of a driving signal supplied to the SOA 2 serving as a responsive element, and includes a circuit part 18 and a driver amplifier 17 similar to that illustrated in FIG. 6. The circuit part 18 includes: resistors 18a and 18b; and an inductor element 18c, the inductance of which can be variable by a control signal from the rectangularity shaping circuit 5b.

When the inductance of the variable inductor element 18c is made variable through the control signal from the rectangularity shaping circuit 5b, the response time constant of the circuit part 18 is made variable. Therefore, the waveforms of the rising and falling edges of the driving pulse signal output from the gate switch driving circuit 5c' are shaped. If the inductance of the variable inductor element 18c is defined as L1 and the resistance values of the resistors 18a and 18b are defined as fixed values R11 and R13, respectively, a response time constant τ2 of the circuit part 18 is expressed by the following Eq. (4). Accordingly, when the inductance L1 is increased, the response time constant τ2 is increased, and when the inductance L1 is decreased, the response time constant τ2 is decreased.

$$\tau_2 = \frac{L_1}{R_{11} + R_{13}} \qquad (4)$$

In other words, the arithmetic control circuit 4 controls the response time constant of the circuit part 18 through the control of the inductance of the variable inductor element 18c via the rectangularity shaping circuit 5b, thereby making it possible to control the waveform of the driving pulse signal output from the gate switch driving circuit 5c'.

Next, an operation example of the foregoing waveform controller 1 or responsive element module 10 will be described.

For example, the waveform controller 1 is used in adjusting the SOAs 102a and 104, each serving as a responsive element applied as a component of the optical packet switch 100, prior to the start of operation of the optical packet switch 100 illustrated in FIG. 1. Alternatively, in the responsive element module 10 including the SOA 2 applied as the SOA 102a or 104, the shaping of a driving pulse waveform supplied to the SOA 2 is carried out.

The driving voltage control circuit 5 supplies a driving signal to the SOA 2, thereby causing an output pulse to be output from the SOA 2. At this point, the input light to the SOA 2 is in a non-input state, and the ASE light, the output and non-output of which are repeated in response to the ON/OFF of the driving signal supplied from the driving voltage control circuit 5, is the output pulse output from the SOA 2. It should be noted that the ON/OFF period of the driving signal, i.e., the pulse period of a driving pulse signal, results from the period of a trigger signal from the arithmetic control circuit 4, and is thus known in the arithmetic control circuit 4.

Furthermore, the rectangularity identifying circuit 3 monitors the waveform of the output pulse output from the SOA 2, thereby identifying the rectangularity of this waveform, or the sharpness of the rising edge of this waveform. For example, the harmonic component extraction part 3a extracts the even-order harmonic component of the output optical pulse output from the SOA 2 during the pulse period, and the power detection circuit 3b detects the power of the extracted even-order harmonic component.

The arithmetic control circuit 4 receives, as a digital signal, the power of the detected even-order harmonic component via the A/D converter 3c. Then, the arithmetic control circuit 4 and the driving voltage control circuit 5 are operated in cooperation with each other, thereby controlling, based on the power of the received even-order harmonic component, the waveform of the driving pulse signal supplied to the SOA 2 so that this power becomes identical to or close to a target value (within the minimum range including the minimum or given error, for example).

More specifically, the capacitance of the variable capacitance element 16a in the circuit part 16 (see FIG. 6) constituting the gate switch driving circuit 5c is made variable by the arithmetic control circuit 4 via the rectangularity shaping circuit 5b, thus shaping the waveform of the driving pulse signal supplied to the SOA 2. Alternatively, the inductance of the variable inductor element 18c in the circuit part 18 (see FIG. 9) constituting the gate switch driving circuit 5c' is made variable, thus shaping the sharpness of the rising edge of the driving pulse signal supplied to the SOA 2.

The SOA 2 outputs an output pulse by being driven by the foregoing driving pulse signal. Therefore, through the control of the waveform of the driving pulse signal output from the gate switch driving circuit 5c via the rectangularity shaping circuit 5b, the arithmetic control circuit 4 can control the rectangularity of the waveform of the output pulse output from the SOA 2.

When the obtainment of the driving pulse signal, which reaches the control target, is enabled as described above, the control amount of the control signal supplied to the rectangularity shaping circuit 5b at this time may be stored in the arithmetic control circuit 4. In such a case, when transition is made to an actual operation thereafter, the gate switch driving circuit 5c can be controlled via the rectangularity shaping circuit 5b by the fixed control amount stored in the arithmetic control circuit 4.

At the time of an actual operation, a trigger signal, responsive to the timing at which conduction/shutoff of input light should be carried out, is input to the gate switch driving circuit 5c from the arithmetic control circuit 4, and therefore, the frequency of the trigger signal will not always be constant. However, the arithmetic control circuit 4 controls the rectangularity shaping circuit 5b based on the stored control amount, thus allowing the rising waveform of output light from the SOA 2 to be shaped into a desired shape. It should be noted that even after the actual operation, in a state where no input light to be subjected to conduction/shutoff is input, the foregoing feedback may be carried out appropriately when necessary.

As described above, the first embodiment has the advantage that a pulse having a target rectangularity can be generated by simple waveform shaping.

It should be noted that in the foregoing first embodiment, an optical pulse including ASE light output from the SOA 2 is monitored, thereby shaping the rectangularity of the optical pulse. In addition to this, an input signal from outside, e.g., input light to be subjected to conduction/shutoff when the SOA 2 is applied as an optical gate switch, may be used to shape the rectangularity of the optical pulse. In this case, the frequency of a trigger signal output from the arithmetic control circuit 4 is set at a known constant frequency, thus allowing the frequency extraction characteristic of the harmonic component extraction part 3a, constituting the rectangularity identifying circuit 3, to be determined based on the above constant frequency.

[B] Second Embodiment

Figure 10:
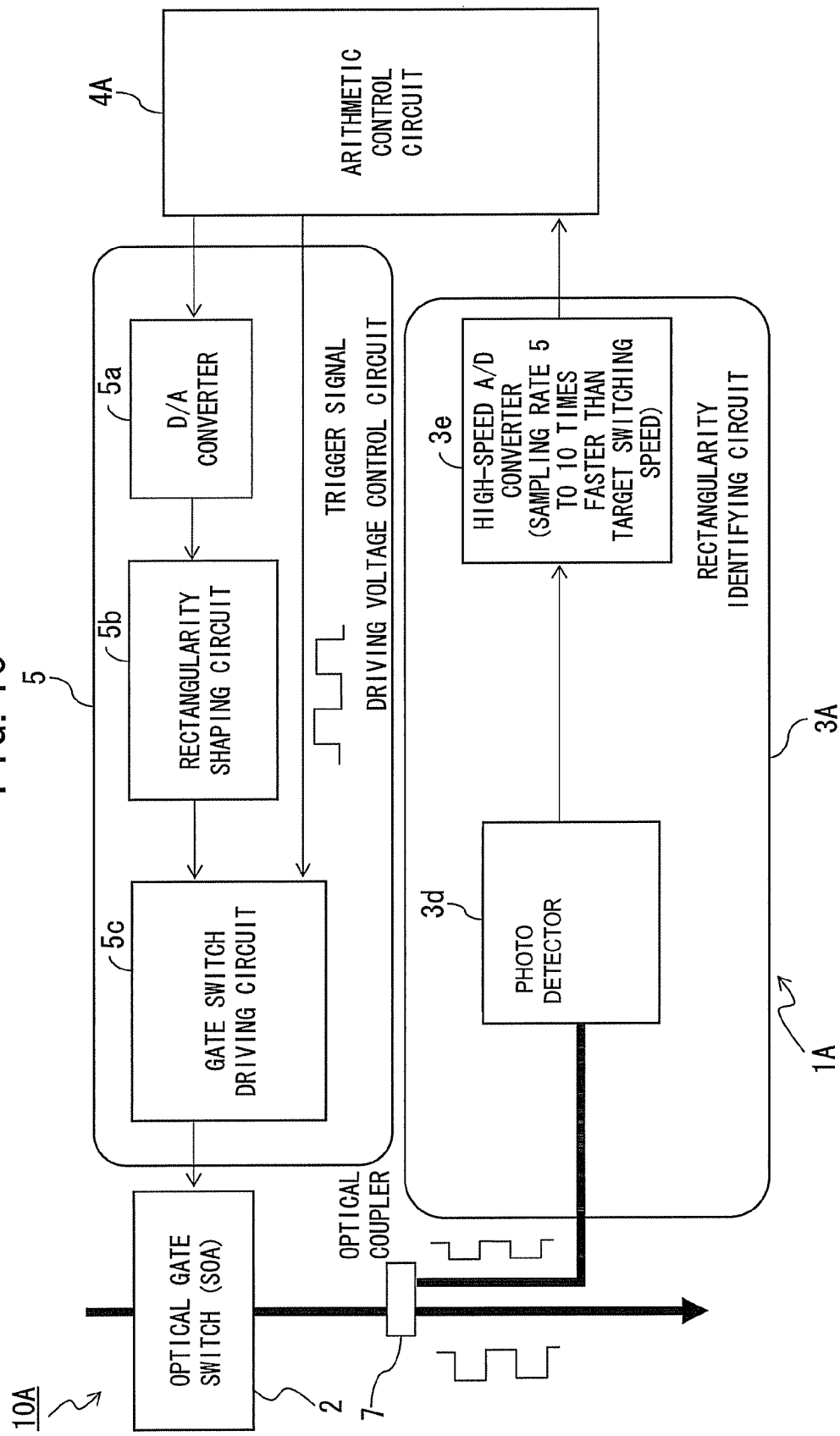
FIG. 10 is a diagram illustrating a second embodiment.

FIG. 10 is a diagram illustrating a waveform controller 1A or a responsive element module 10A according to a second embodiment. In the second embodiment, unlike the first embodiment described above, a rectangularity identifying circuit 3A including different components is provided, and an arithmetic control circuit 4A having a different control mode is provided. It should be noted that the foregoing reference characters represent substantially the same parts. Specifically, the waveform controller 1A includes: the rectangularity identifying circuit 3A; the arithmetic control circuit 4A; and a driving voltage control circuit 5 similar to that of the first embodiment, and the responsive element module 10A includes: components serving as the foregoing waveform controller 1A; and a SOA 2.

The rectangularity identifying circuit 3A is one example of a monitor for monitoring the waveform of an output pulse obtained by the response of the SOA 2 to a driving signal supplied to this SOA 2 serving as a responsive element, and in the second embodiment, the rectangularity identifying circuit 3A includes a light-receiving part 3d and a high-speed A/D converter 3e. The light-receiving part 3d receives, via an optical coupler 7, light output from the SOA 2, and converts the received light into an electric signal such as a voltage signal having an amplitude change responsive to that of the optical pulse. A photodiode (PD) and a trans-impedance amplifier are operated in cooperation with each other, and are thus equivalent to one example of the light-receiving part 3d.

Further, the high-speed A/D converter 3e is one example of a sampling part for sampling the waveform of an output pulse, and performs high speed sampling of the electric signal from the light-receiving part 3d. In order to perform sampling of an amplitude change responsive to an optical pulse, the high-speed A/D converter 3e has to perform sampling of a plurality of points of a response waveform when ON/OFF switching of the SOA 2 is performed.

Therefore, as the high-speed ND converter 3e, for example, one having a sampling rate, which is about 5 to 10 times faster than the speed of ON/OFF switching of the SOA 2, is used. For example, in the case of using an optical gate switch having the ability to perform switching in 10 nanoseconds, a converter having a sampling rate of 1 to 2 nanoseconds, which is 5 to 10 times faster than the speed of this switching, is used. That is, as the high-speed A/D converter 3e, one having a sampling rate of 500 Msps to 1 Gsps or more is used.

The arithmetic control circuit 4A is equivalent to one example of a driving waveform shaping part that operates in cooperation with the driving voltage control circuit 5, thereby shaping, based on a sampling result obtained by the sampling part 3e, the waveform of a driving signal supplied to the SOA 2. More specifically, the arithmetic control circuit 4A outputs a trigger signal having a constant frequency to a gate switch driving circuit 5c, performs a computation using an output from the high-speed ND converter 3e, and outputs, based on this computation result, a control signal supplied to the rectangularity shaping circuit 5b. The control signal supplied to the rectangularity shaping circuit 5b is a control signal for changing the circuit time constant of the circuit part 16 or the circuit part 18 (see FIG. 6 or FIG. 9) constituting the gate switch driving circuit 5c (5c') as explained above.

In one example, the arithmetic control circuit 4A derives, by a computation such as dispersion, for example, the change index of the value sampled in a rising edge region of an output pulse by the high-speed ND converter 3e, and outputs a control signal responsive to the derived result to the rectangularity shaping circuit 5b. For example, when the control amount of the control signal to the rectangularity shaping circuit 5b is controlled in the arithmetic control circuit 4A so that the computed dispersion is minimized, the waveform of an output pulse output from the SOA 2 becomes closest to a true (ideal) rectangular wave shape as compared with the case where the control signal provides a different control amount.

Figure 11:
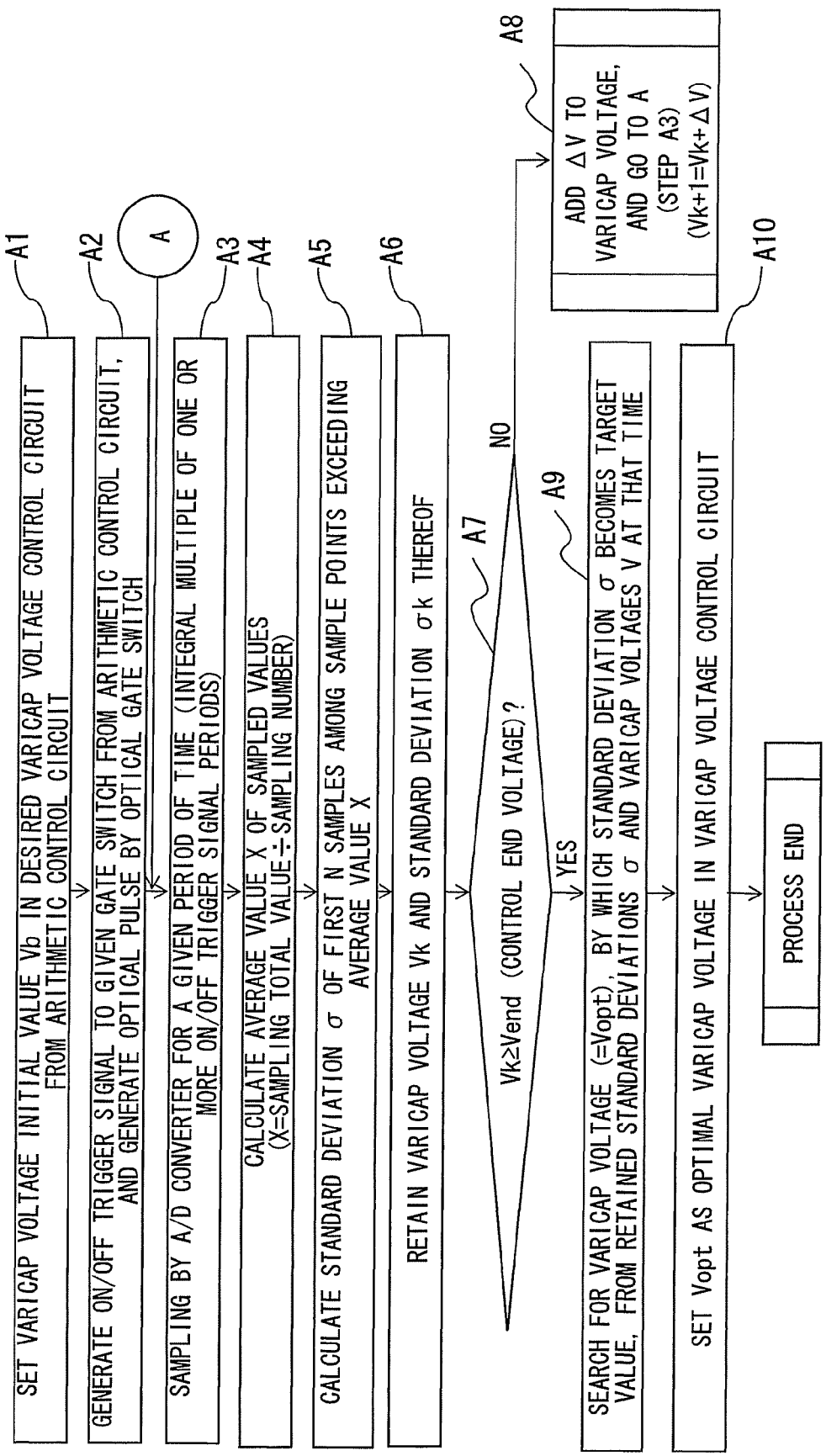
FIG. 11 is a flow chart for illustrating an operation example according to the second embodiment.

FIG. 11 is a method for illustrating an operation example of the waveform controller 1A with attention focused on the process of the arithmetic control circuit 4A. First, a control signal for initializing a control amount in the rectangularity shaping circuit 5b is output from the arithmetic control circuit 4A to the rectangularity shaping circuit 5b. When the circuit part 16 having the variable capacitance element 16a as the varicap illustrated in FIG. 6 is applied as a component of the gate switch driving circuit 5c, a control signal, by which a control voltage signal supplied to this varicap 16a is set at an initial value Vk=Vb, is output to the rectangularity shaping circuit 5b (Operation A1)

Subsequently, a trigger signal for ON/OFF control of ASE light output from the SOA 2 is generated in the arithmetic control circuit 4A, and is supplied to the gate switch driving circuit 5c. Thus, the SOA 2 can output an output optical pulse (e.g., ASE light) having a rising waveform responsive to the initial value of a varicap voltage (Operation A2).

Then, sampling results obtained for a given period of time for the output optical pulse output from the SOA 2 are received from the high-speed A/D converter 3e. In one example, the arithmetic control circuit 4A receives, from the high-speed ND converter 3e, sampling results for a period of time for an integral multiple of 1 or more periods of the known trigger signal, and a storage region is provided in a memory or the like, for example, so that the sampling results are retained in chronological order (Operation A3).

Then, for the sampling results obtained for the above given time period, which are retained in the foregoing storage region, an average value X thereof (=sampling total value÷sampling number) is calculated (Operation A4).

Figure 12:
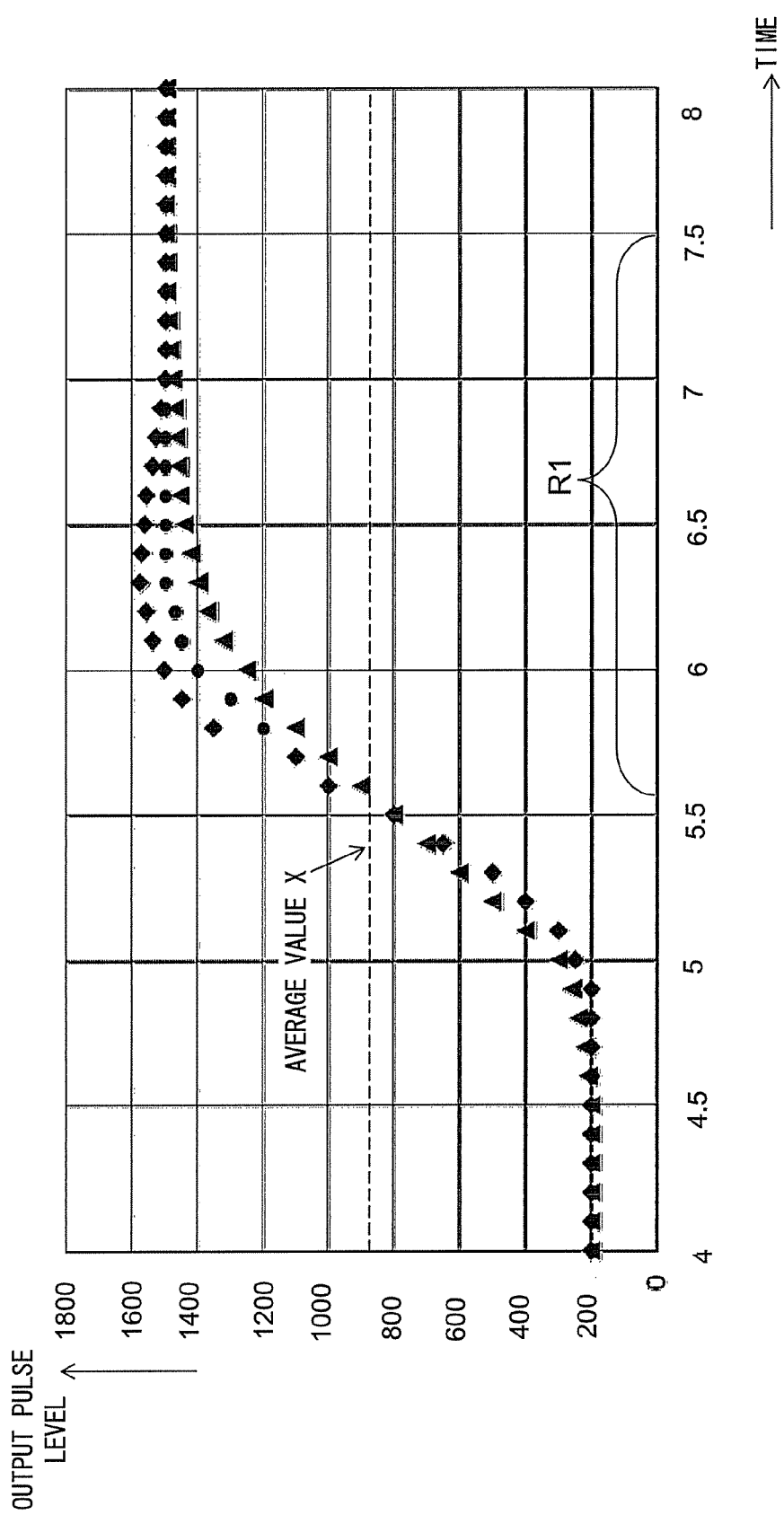
FIG. 12 is a graph illustrating operational functions of an arithmetic control circuit according to the second embodiment.

Next, sample points exceeding the calculated average value X are extracted from among the sampling results obtained for the above given time period, which are retained in the storage region, and furthermore, a standard deviation a of first N samples in chronological order among the extracted sample points is calculated (Operation A5). As illustrated in FIG. 12, in accordance with the value of capacitance of the variable capacitance element 16a, the number of the first N samples may be around the number of the sample points within a time range R1 in which variations in the rising waveform of an output optical pulse appear.

The standard deviation σ calculated as described above is stored in an unillustrated storage region in association with the value of the set voltage signal Vk (Operation A6). Subsequently, the voltage signal from the rectangularity shaping circuit 5b is varied by a unit width ΔV (Vk=Vk+ΔV) across the control range (Vb to Vend). Then, based on the sampling results obtained on an as-needed basis, the standard deviation is computed as described above (from No route of Operation A7 to Operation A8, and Operation A3 to Operation A6).

When the computation of the value of the standard deviation across the foregoing control range has been finished, i.e., when Vk≥Vend in Operation A7 (Yes route of Operation A7), reference is made to the foregoing storage region to search for the value of the voltage signal having the standard deviation serving as a target point (Operation A9). That is, from the relationship of the value of the standard deviation retained in the storage region and responsive to the value of the voltage signal in the rectangularity shaping circuit 5b, a search is made for the voltage signal value by which the standard deviation a becomes a target value (e.g., a minimum standard deviation).

Then, the voltage signal value for which the search is made in this manner is defined as an optimal voltage signal value Vopt. Specifically, the arithmetic control circuit 4A outputs a control signal, thereby setting, as the optimal voltage signal value Vopt, the voltage signal supplied from the rectangularity shaping circuit 5b to the varicap 16a of the gate switch driving circuit 5c (Operation A10).

When the rising edge is closest to a true rectangular wave shape, variations in the standard deviation a are minimized, and therefore, the standard deviation σ takes on the minimum value. Accordingly, as illustrated above, through the control signal supplied to the rectangularity shaping circuit 5b, the rectangularity of a pulse is controlled so that the calculated standard deviation σ is minimized. Thus, the resulting waveform of the output optical pulse can be brought closest to a rectangular wave shape as compared with an output optical pulse having a different standard deviation.

As described above, the second embodiment also has the advantage that a pulse having a target rectangularity can be generated by simple waveform shaping.

It should be noted that in the foregoing case, the standard deviation is calculated for the sample points within the range in which variations in the rising waveform of the output optical pulse appear, but the standard deviation may be calculated for sample points within the range in which variations in a falling waveform appear. In such a case, after the average value X has been calculated similarly to Operation A4 described above, the standard deviation σ may be calculated for first N samples of sample points below the average value X.

[C] Third Embodiment

Figure 13:
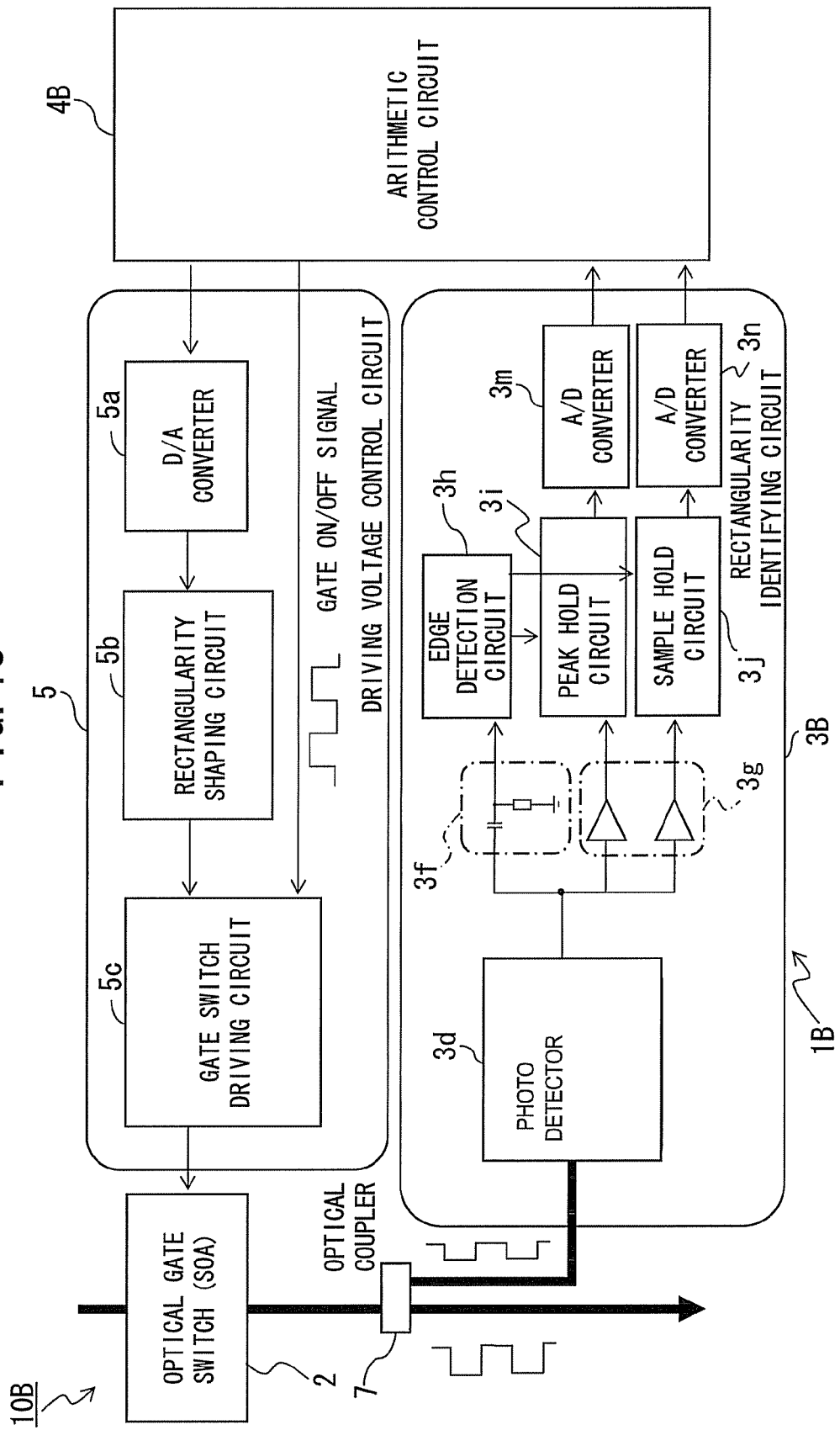
FIG. 13 is a diagram illustrating a third embodiment.

FIG. 13 is a diagram illustrating a waveform controller 1B or a responsive element module 10B according to a third embodiment. In the third embodiment, unlike the first and second embodiments described above, a rectangularity identifying circuit 3B including different components is provided, and an arithmetic control circuit 4B having a different control mode is provided. It should be noted that the foregoing reference characters represent substantially the same parts. Specifically, the waveform controller 1B includes: the rectangularity identifying circuit 3B; the arithmetic control circuit 4B; and a driving voltage control circuit 5 similar to that of the first or second embodiment, and the responsive element module 10B includes: components serving as the foregoing waveform controller 1B; and a SOA 2.

The rectangularity identifying circuit 3B is one example of a monitor for monitoring the waveform of an output pulse obtained by the response of the SOA 2 to a driving signal supplied to this SOA 2 serving as a responsive element. The rectangularity identifying circuit 3B according to the third embodiment includes: a light-receiving part 3d; an AC coupling part 3f; a level adjustment part 3g; an edge detection circuit 3h; a peak hold circuit 3i; a sample hold circuit 3j; and two ND converters 3m and 3n. The light-receiving part 3d is similar to that illustrated in the second embodiment.

The AC (Alternating Current) coupling part 3f performs AC coupling to eliminate a direct current component from an electric signal supplied from the light-receiving part 3d, and outputs the resulting signal to the edge detection circuit 3h. Furthermore, the level adjustment part 3g includes amplifiers for performing level adjustment on electric outputs from the light-receiving part 3d, and outputs the resulting signals to the peak hold circuit 3i and the sample hold circuit 3j, respectively.

The edge detection circuit (edge detection part) 3h receives, from the AC coupling part 3f, the output pulse from which the direct current component has been eliminated as an electric signal, and detects rising edge and falling edge of a waveform of the output pulse.

Further, based on the detection of the rising edge by the edge detection circuit 3h, the peak hold circuit (peak hold part) 3i holds the value of rising peak level, which is included in the waveform of the output pulse and responsive to the rising edge of a driving signal. More specifically, the peak value (maximum value) of the output pulse from the level adjustment part 3g is held for the time necessary for the detection of rising peak levels from the switching time of the SOA 2, triggered by the detection of the rising edge to be detected by the edge detection circuit 3h.

Figure 14:
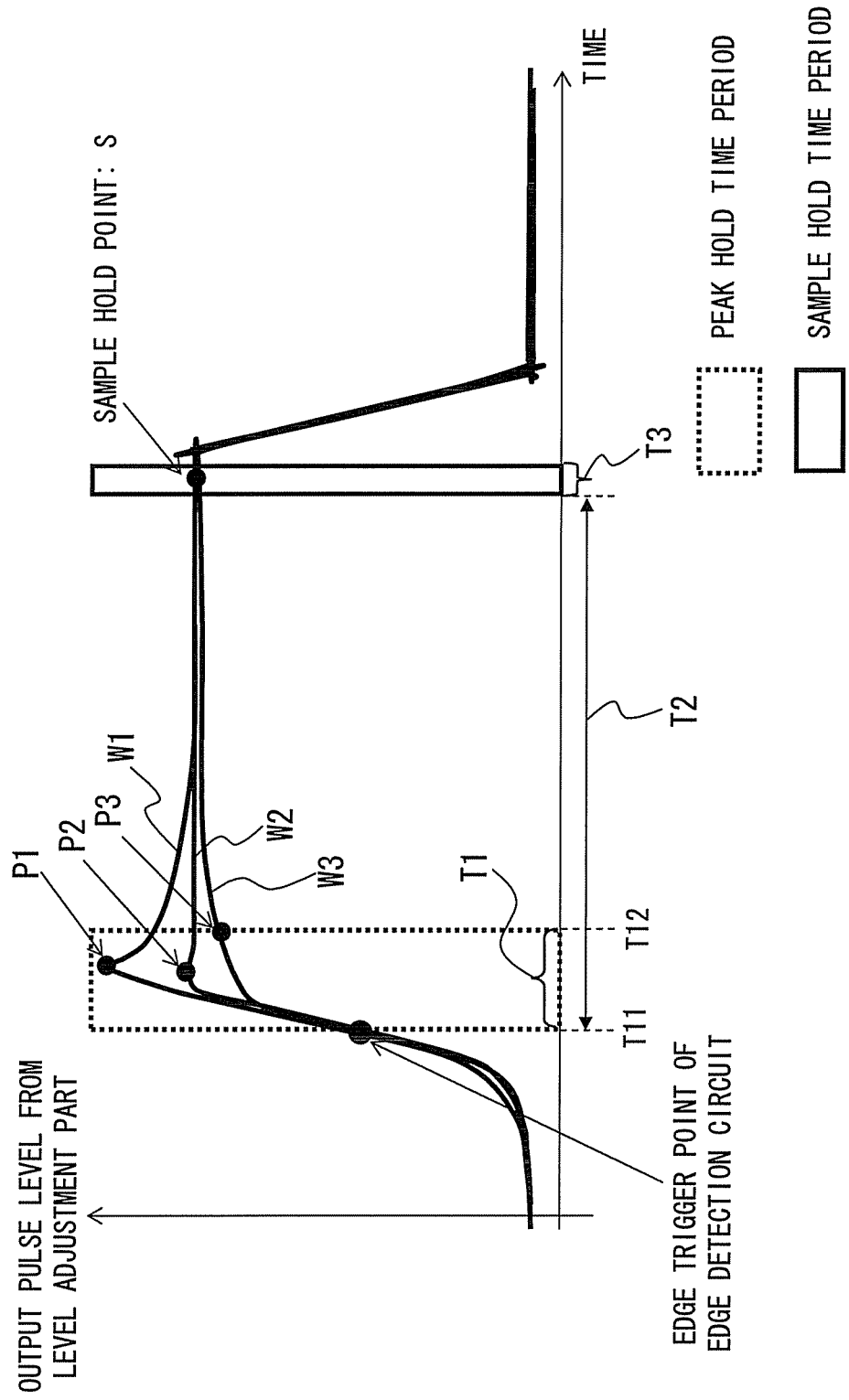
FIG. 14 is a diagram illustrating operational functions according to the third embodiment.

The time necessary for the detection of rising peak levels may be determined as illustrated in FIG. 14, for example. Specifically, the time necessary for the detection of rising peak levels may be determined as a time T1 between a time point (time point T11) at which the detection starts upon reception of a trigger signal resulting from the detection of the rising edge by the edge detection circuit 3h, and a given time point T12 at which these rising edges start to converge. Thus, as illustrated in FIG. 14, in the peak hold circuit 3i, rising peak levels P1, P2 and P3 can be obtained in accordance with rising waveforms W1, W2 and W3, which differ according to the capacitance of the variable capacitance element 16a (see FIG. 6).

It should be noted that due to the foregoing peak hold operation performed in the peak hold circuit 3i, the peak hold circuit 3i or the edge detection circuit 3h can have a time management function for the foregoing time T1.

Alternatively, although the peak hold circuit 3i starts the peak hold upon reception of the trigger signal resulting from the detection of the rising edge by the edge detection circuit 3h, the peak hold circuit 3i may continue the peak hold until the reception of a trigger signal resulting from the detection of a falling edge by the edge detection circuit 3h.

Moreover, based on the detection of the rising edge by the edge detection circuit 3h, the sample hold circuit (sample hold part) 3j performs sample hold of the value of level of the output pulse, which is a response waveform level corresponding to a flat region prior to the falling edge of the driving signal.

More specifically, at a time when the level of the output pulse is stabilized prior to the falling edge after a given period of time has elapsed since the detection of the rising edge by the edge detection circuit 3h, the sample hold of a value S of this level is performed.

For example, as illustrated in FIG. 14, the sample hold circuit 3j performs sample hold of the level value of the output pulse at a time T3 (i.e., a time immediately before the falling edge) when the level is stabilized after a lapse of a time T2 since the reception of the trigger signal resulting from the detection of the rising edge (T11). Due to the foregoing sample hold operation performed by the sample hold circuit 3j, the sample hold circuit 3j or the edge detection circuit 3h can have a time management function for the foregoing times T2 and T3.

The output pulse input to the rectangularity identifying circuit 3B has an ON/OFF period corresponding to the trigger signal output from the arithmetic control circuit 4B. Accordingly, also in the sample hold circuit 3j, an ON time is fixed between the rising edge of the output pulse and the falling edge thereof. Therefore, in the sample hold circuit 3j or the edge detection circuit 3h, the foregoing times T2 and T3 can be set in accordance with the value of this ON time.

The ND converter 3m converts an analog signal, indicative of the value of the rising peak level from the peak hold circuit 3i, into a digital signal, and outputs the digital signal to the arithmetic control circuit 4B. Furthermore, the ND converter 3n converts an analog signal, indicative of the value of the sample hold performed in the sample hold circuit 3j, into a digital signal, and outputs the digital signal to the arithmetic control circuit 4B.

The arithmetic control circuit 4B is operated in cooperation with the driving voltage control circuit 5 to receive, as monitoring results, the value held in the peak hold circuit 3i and the value of the sample hold performed in the sample hold circuit 3j, and is thus equivalent to one example of a driving waveform variable part for shaping the waveform of a driving signal based on these monitoring results.

More specifically, the arithmetic control circuit 4B outputs a trigger signal of a constant frequency to the gate switch driving circuit 5c, performs a computation using each of the outputs from the ND converters 3m and 3n, and outputs a control signal to the rectangularity shaping circuit 5b based on the computation result. As explained above, the control signal output to the rectangularity shaping circuit 5b is a control signal for changing the response time constant of the circuit part 16 (or 18) through the control of the capacitance of the variable capacitance element 16a illustrated in FIG. 6 (or the inductance of the variable inductor element 18c illustrated in FIG. 9).

In one example, the peak hold value from the ND converter 3m is determined as a rising amplitude value, while the sample hold value from the ND converter 3n is determined as a falling amplitude value, and a difference between both of the amplitude values is computed. In accordance with the value of the difference computed in this manner, the control amount provided by the foregoing control signal output to the rectangularity shaping circuit 5b is controlled. For example, when the control amount provided by the control signal to the rectangularity shaping circuit 5b is controlled so that the computed difference value is minimized, the waveform of the output pulse output from the SOA 2 is brought closest to a true (ideal) rectangular wave shape as compared with the case where the control signal provides a different control amount.

Figure 15:
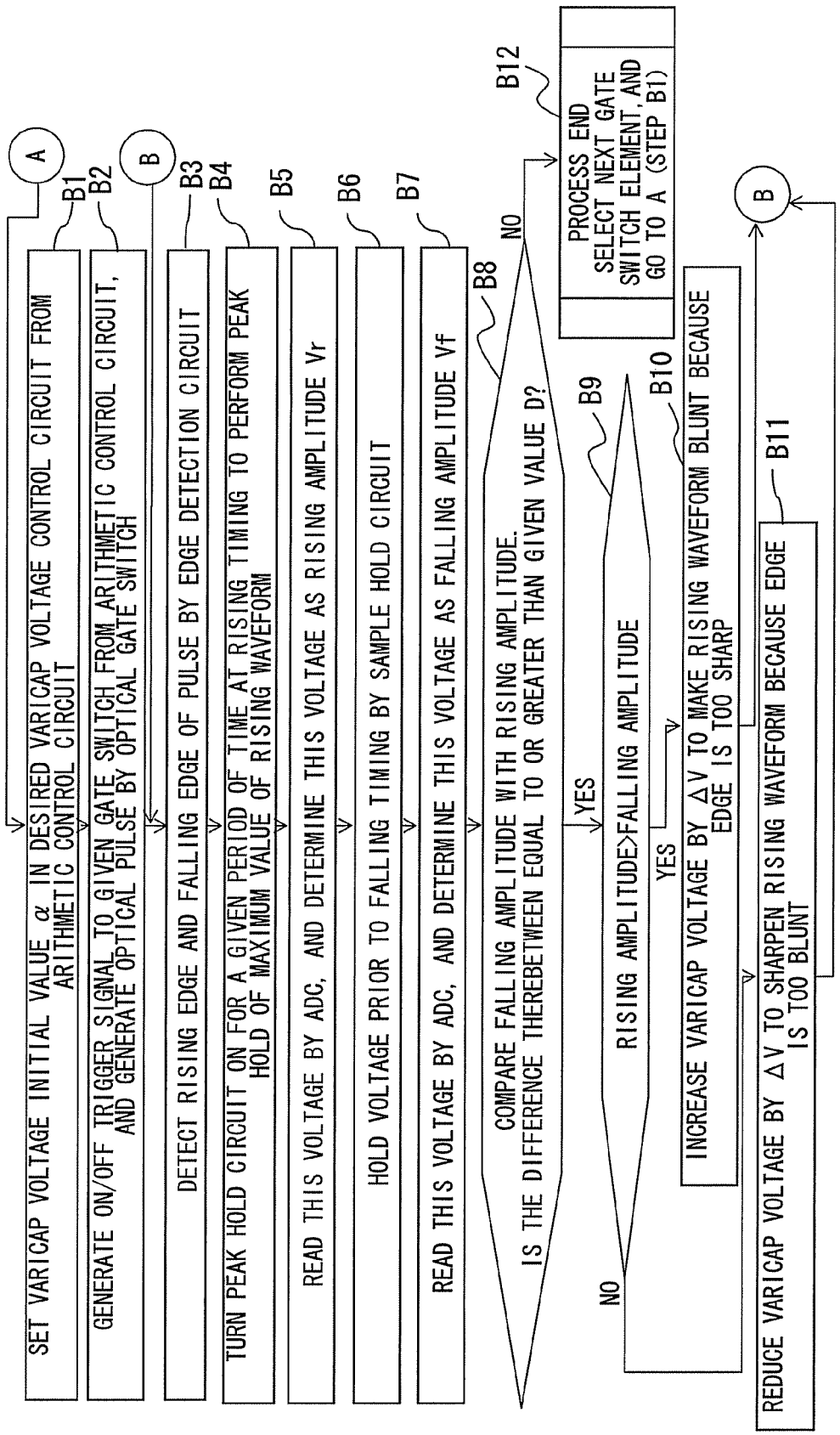
FIG. 15 is a method chart for illustrating an operation example according to the third embodiment.

FIG. 15 is a method illustrating an operation example of the waveform controller 1B with attention focused on the process of the arithmetic control circuit 4B. In this operation example, the waveform controller 1B is applied to the optical packet switch 100 illustrated in FIG. 1, and driving signals (or output optical pulse waveforms) supplied to a plurality of the SOAs 102a and 104 are shaped in sequence so that ideal rectangular wave shapes are provided. Furthermore, the circuit part 16 illustrated in FIG. 6 is applied to the gate switch driving circuit 5c, and a varicap is applied as the variable capacitance element 16a illustrated in FIG. 6.

First, a control signal for initializing a control amount in the rectangularity shaping circuit 5b is output from the arithmetic control circuit 4B to the rectangularity shaping circuit 5b. When the circuit part 16 having the variable capacitance element 16a as the varicap illustrated in FIG. 6 is applied as a component of the gate switch driving circuit 5c, a control signal, by which a control voltage signal supplied to this varicap 16a is set at an initial value α, is output (Operation B1).

Subsequently, a trigger signal for ON/OFF control of ASE light output from the SOA 2 is generated in the arithmetic control circuit 4B, and is supplied to the gate switch driving circuit 5c. Thus, the SOA 2 can output an output optical pulse (e.g., ASE light) having a rising waveform responsive to the initial value of a varicap voltage (Operation B2).

Then, from the output pulse input from the light-receiving part 3d via the AC coupling part 3f, rising and falling edges of the output pulse are detected by the edge detection circuit 3h (Operation B3). In this case, upon detection of the edges, the edge detection circuit 3h outputs trigger signals, each indicative of the edge detection, to the peak hold circuit 3i and the sample hold circuit 3j.

Moreover, with the trigger signal responsive to the rising edge from the edge detection circuit 3h, the peak hold circuit 3i is activated for a given period of time at the timing of the rising edge of the output pulse. Then, the peak hold circuit 3i holds a peak value (maximum value) of the rising waveform (Operation B4). Further, the ND converter 3m reads the peak value held in the peak hold circuit 3i, and outputs, as a rising amplitude Vr, the read peak value to the arithmetic control circuit 4B (Operation B5).

Furthermore, at a time when the level of the output pulse is stabilized prior to the falling edge after a given period of time has elapsed since the detection of the rising edge by the edge detection circuit 3h, the sample hold circuit 3j performs the sample hold of a value S of this level (Operation B6). Then, the ND converter 3n reads the peak value held in the sample hold circuit 3j, and outputs, as a falling amplitude Vf, the read peak value to the arithmetic control circuit 4B (Operation B7).

The arithmetic control circuit 4B makes a comparison between the rising amplitude value Vr and the falling amplitude value Vf, which are supplied from the A/D converters 3m and 3n, respectively. When a difference between both the amplitude values is equal to or greater than a given value D, the waveform of the output pulse output from the SOA 2 is deformed from an ideal rectangular wave shape; therefore, the control amount of the control signal to the rectangularity shaping circuit 5b is changed so that the waveform is brought closer to an ideal rectangular wave shape (Yes route of Operation B8).

More specifically, when the rising amplitude Vr is greater than the falling amplitude Vf (Yes route of Operation B9), the edge is too sharp, i.e., the rising edge is too steep for an ideal rectangularity. Therefore, through the control signal output from the arithmetic control circuit 4B to the rectangularity shaping circuit 5b, the varicap voltage from the rectangularity shaping circuit 5b is increased by ΔV, thereby making the rising waveform blunt (Operation B10).

Further, when the rising amplitude Vr is equal to or less than the falling amplitude Vf (No route of Operation B9), the edge is too blunt, i.e., the rising edge is too blunt for an ideal rectangularity. Therefore, through the control signal output from the arithmetic control circuit 4B to the rectangularity shaping circuit 5b, the varicap voltage from the rectangularity shaping circuit 5b is reduced by ΔV, thereby sharpening the rising waveform (Operation B11).

Until the difference between the rising amplitude value Vr and the falling amplitude value Vf becomes smaller than the value D, the arithmetic control circuit 4B repeats the control for changing the varicap voltage as described above (from Operation B10 or B11 to Operation B3).

When the difference between the rising amplitude Vr and the falling amplitude Vf has become smaller than the given value D through the control of the varicap voltage supplied from the rectangularity shaping circuit 5b, the adjustment of the driving signal to this SOA 2 (SOA 102a or 104), which is to be subjected to driving signal adjustment, ends. In this manner, driving signals will be adjusted in sequence for all of the SOAs 102a and 104, which are objects to be measured (Operation B12).

Upon end of the adjustment of the driving signals for all the SOAs, an actual operation of an apparatus can be started. For example, upon completion of the adjustment of the driving signals for all the SOAs 102a and 104 constituting the optical packet switch 100 illustrated in FIG. 1, an actual operation of the optical packet switch 100 is enabled. That is, the SOAs 102a can each be used as an optical gate switch to control conduction/shutoff of input light, or the SOAs 104 can each be used to amplify input light in addition to conduction/shutoff thereof.

It should be noted that the reference value D for the foregoing difference between the amplitudes Vr and Vf may be set, for example, so as to correspond to an allowable value by which the waveform of the output pulse output from the SOA 2 can obtain a target rectangularity.

It should also be noted that in the foregoing operation example, the control is carried out so that the output pulse from the SOA 2 is brought close to an ideal rectangular wave shape, but the control may be carried out with the objective of allowing the output pulse from the SOA 2 to take on a specific rectangular wave shape that is not ideal. In one example, the arithmetic control circuit 4B may control the rectangularity shaping circuit 5b so that the difference between the rising amplitude value and falling amplitude value becomes a specific value (which is not the minimum value) including an error range.

As described above, the third embodiment also has the advantage that a pulse having a target rectangularity can be generated by simple waveform shaping.

[D] Examples

Figure 16:
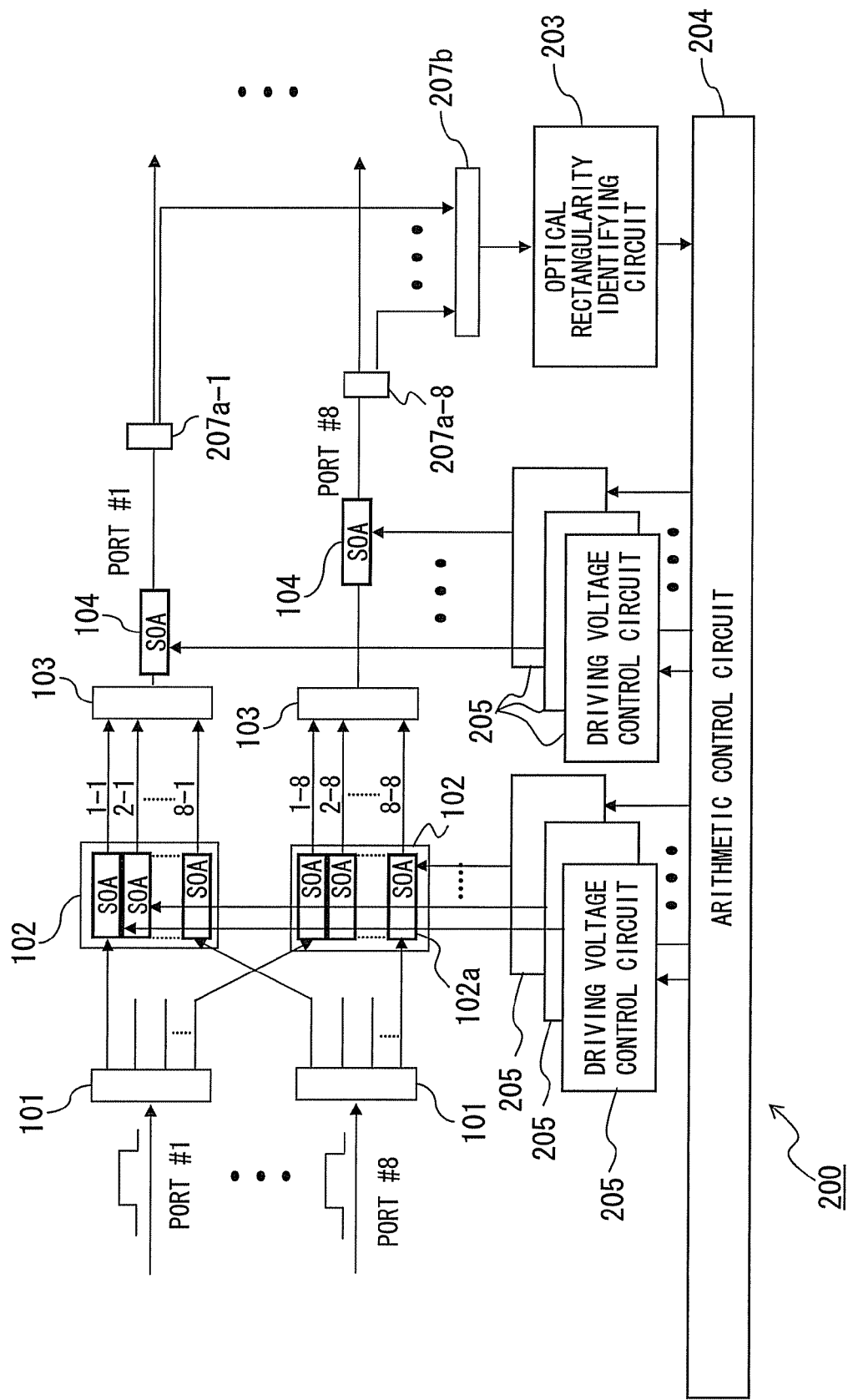
FIG. 16 is a diagram for illustrating application examples of the first to third embodiments.

The waveform controllers 1, 1A and 1B and the responsive element modules 10, 10A and 10B, which are illustrated in the foregoing first to third embodiments, can be applied to an optical packet switch for performing optical packet switching, for example. One example of such an application is illustrated in FIG. 16. Similarly to the optical packet switch 100 illustrated in FIG. 1, an optical packet switch 200 illustrated in FIG. 16 includes eight 1:8 couplers 101, eight 8:8 optical gate switch parts 102, eight 8:1 couplers 103, and eight SOAs 104. It should be noted that the same reference characters as those used in FIG. 1 represent substantially the same parts.

The optical packet switch 200 is one example of an optical switch apparatus having a plurality of SOAs 102a and 104, each serving as an optical gate switch for switching conduction/shutoff of input light in response to a driving signal. The optical packet switch 200 includes: optical couplers 207a-1 to 207a-8 and 207b; a rectangularity identifying circuit 203; an arithmetic control circuit 204; driving voltage control circuits 205, the number of which correspond to the number of the SOAs 102a; and driving voltage control circuits 205, the number of which correspond to the number of the SOAs 104.

There are provided the 72 driving voltage control circuits 205, 64 of which are associated with the 64 SOAs 102a constituting the 8:8 optical gate switch parts 102, and eight of which are associated with the eight SOAs 104. Each of the driving voltage control circuits 205 supplies a driving signal to the associated one of the SOAs 102a and 104. As each of the driving voltage control circuits 205, the driving voltage control circuit 5, which is a component of the waveform controller 1, 1A and 1B in the foregoing embodiments, may be applied.

Specifically, gate switch driving circuits 5c (see FIG. 2, 10 or 13), constituting the respective driving voltage control circuits 205, are provided so as to be associated with a plurality of the optical gate switches 102a and 104 connected by cascade connection, and thus serve as examples of a plurality of driving circuit parts each shaping, based on a control signal, the waveform of a driving signal to the associated one of the optical gate switches 102a and 104.

The arithmetic control circuit 204 outputs trigger signals for driving the associated SOAs 102a and 104 to the gate switch driving circuits 5c constituting the respective driving voltage control circuits 205, and supplies control signals to the rectangularity shaping circuits 5b constituting the respective driving voltage control circuits 205. As the arithmetic control circuit 204, one aspect of the arithmetic control circuits 4, 4A and 4B, which are components of the waveform controllers 1, 1A and 1B in the foregoing embodiments, may be applied in order to control the above-described 72 driving voltage control circuits 205.

Accordingly, the rectangularity shaping circuits 5b (see FIG. 2, 10 or 13) constituting the respective driving voltage control circuits 205, and the arithmetic control circuit 4, 4A or 4B are operated in cooperation with each other, and are thus equivalent to one example of a control part for outputting control signals to the driving circuit parts 5c based on monitoring results obtained by the monitor 203.

The optical couplers 207a-1 to 207a-8 each cause the light, which propagates through output ports #1 to #8, to branch off. The optical coupler 207b merges the branched optical paths from the optical couplers 207a-1 to 207a-8 into one, and provides the input of the rectangularity identifying circuit 203.

The rectangularity identifying circuit 203 is one example of a monitor for monitoring the waveforms of output optical pulses (output pulses) output from the 72 SOAs 102a and 104, and identifies the rectangularity of the output optical pulses. In this case, the light, output from the SOAs 102a constituting the 8:8 optical gate switch part(s) 102 associated with the output port(s) #j (j=an integer of 1 to 8) and the downstream side SOA(s) 104 associated therewith, is input to the rectangularity identifying circuit 203 via the optical couplers 207a-j and 207b.

At this time, the rectangularity of the optical pulses output from the respective ones of the SOAs 102a and 104 can be identified in sequence in accordance with a mode of supply of the driving signals from the driving voltage control circuits 205 to the respective SOAs 102a and 104. Furthermore, as the rectangularity identifying circuit 203, one aspect of the rectangularity identifying circuits 3, 3A and 3B, which are components of the waveform controllers 1, 1A and 1B in the foregoing embodiments, may be applied.

Although the 72 driving voltage control circuits 205 are provided so as to be associated with the SOAs 102a and 104 as explained above, the shared use of the arithmetic control circuit 204 and the rectangularity identifying circuit 203 is enabled for the SOAs 102a and 104. Specifically, the respective driving voltage control circuits 205 and the arithmetic control circuit 204 are operated in cooperation with each other, and are thus equivalent to a driving waveform shaping part for shaping, based on monitoring results obtained by the monitor 203, the waveforms of the driving signals to the optical gate switches 102a and 104, for which optical waveforms output therefrom have been monitored.

Next, an operation example of adjustment of driving signals for driving the respective SOAs 102a and 104 prior to the start of operation of the optical packet switch 200 will be described. In adjusting the driving signals for the respective SOAs 102a and 104, the driving signals for the downstream side SOAs 104 constituting the optical packet switch 200 are preferentially adjusted.

In association with each of the output ports #1 to #8, one of the SOAs 104 is provided at the most downstream side, while the eight SOAs 102a are provided at the upstream side; thus, the outputs to the respective output ports #1 to #8 are merged via the optical couplers 207a-1 to 207a-8 and 207b and connected to the rectangularity identifying circuit 203. Accordingly, the output optical pulses output through the downstream side SOAs 104 will be monitored in order to adjust the driving signals supplied to the upstream side SOAs 102a.

Therefore, in adjusting the driving signals supplied to the upstream side SOAs 102a associated with one of the output ports, the adjustment of the driving signal supplied to the associated downstream side SOA 104 has preferably already been completed. Thus, influences, which occur when the driving signal to the downstream side SOA 104 has not yet been adjusted, can be prevented from being exerted on the adjustment of the driving signals supplied to the upstream side SOAs 102a.

For example, in association with one output port #j, the driving signal supplied from the driving voltage control circuit 205 to the most downstream SOA 104 is adjusted first, and then the driving signals supplied from the driving voltage control circuits 205 to the eight upstream side SOAs 102a are adjusted. Thereafter, the driving signals supplied to the SOAs 104 and 102a for the other output ports are similarly adjusted.

Specifically, the driving signals supplied to the upstream side SOAs 102a are turned OFF by the arithmetic control circuit 204, while the arithmetic control circuit 204 supplies a trigger signal to the driving voltage control circuit 205 associated with one of the SOAs 104, thereby generating an output optical pulse including ASE light therefrom. This output optical pulse is input to the rectangularity identifying circuit 203 via the optical couplers 207a-j and 207b. Then, the arithmetic control circuit 204 and this driving voltage control circuit 205 are operated in cooperation with each other, thereby realizing the shaping of the waveform of the driving signal based on the monitoring result from the rectangularity identifying circuit 203.

It should be noted that in shaping the driving signals to the eight upstream side SOAs 102a, the SOA 104 located downstream of the SOAs 102a to be adjusted is fixed in the ON state. Thus, the optical pulses resulting from ASE light generated by the upstream side SOAs 102a are input to the rectangularity identifying circuit 203 via the downstream side SOA 104 and the optical couplers 207a-j, 207b, and can therefore be monitored.

Alternatively, the driving signals for the downstream side SOAs 104 associated with the respective output ports #1 to #8 may be preferentially adjusted in sequence, and then the driving signals for the upstream side SOAs 102a associated with the respective output ports #1 to #8 may be adjusted.

When the operation of adjustment of the driving signals for all the SOAs 102a and 104 has been completed in this manner, the start of an actual operation of the optical packet switch 200 is enabled.

As described above, by application of the illustrated waveform controller 1, 1A or 1B as a component of the optical packet switch 200, a multiport-to-multiport optical packet switch system can be easily configured. Specifically, the necessity for individual adjustment of the driving circuit for each of the optical gate switches 102a and 104 is eliminated, thus enabling a considerable reduction in the man-hour required for assembly and adjustment. Further, even after the start of operation of the apparatus, the efficiency of adjustment works for the respective optical gate switches 102a and 104 is increased, and therefore, the maintainability and system reliability are also improved. That is, the driving waveforms for the respective optical gate switches 102a and 104 are optimized regularly, thus enabling the maintenance of apparatus performance for the long term.

Figure 17:
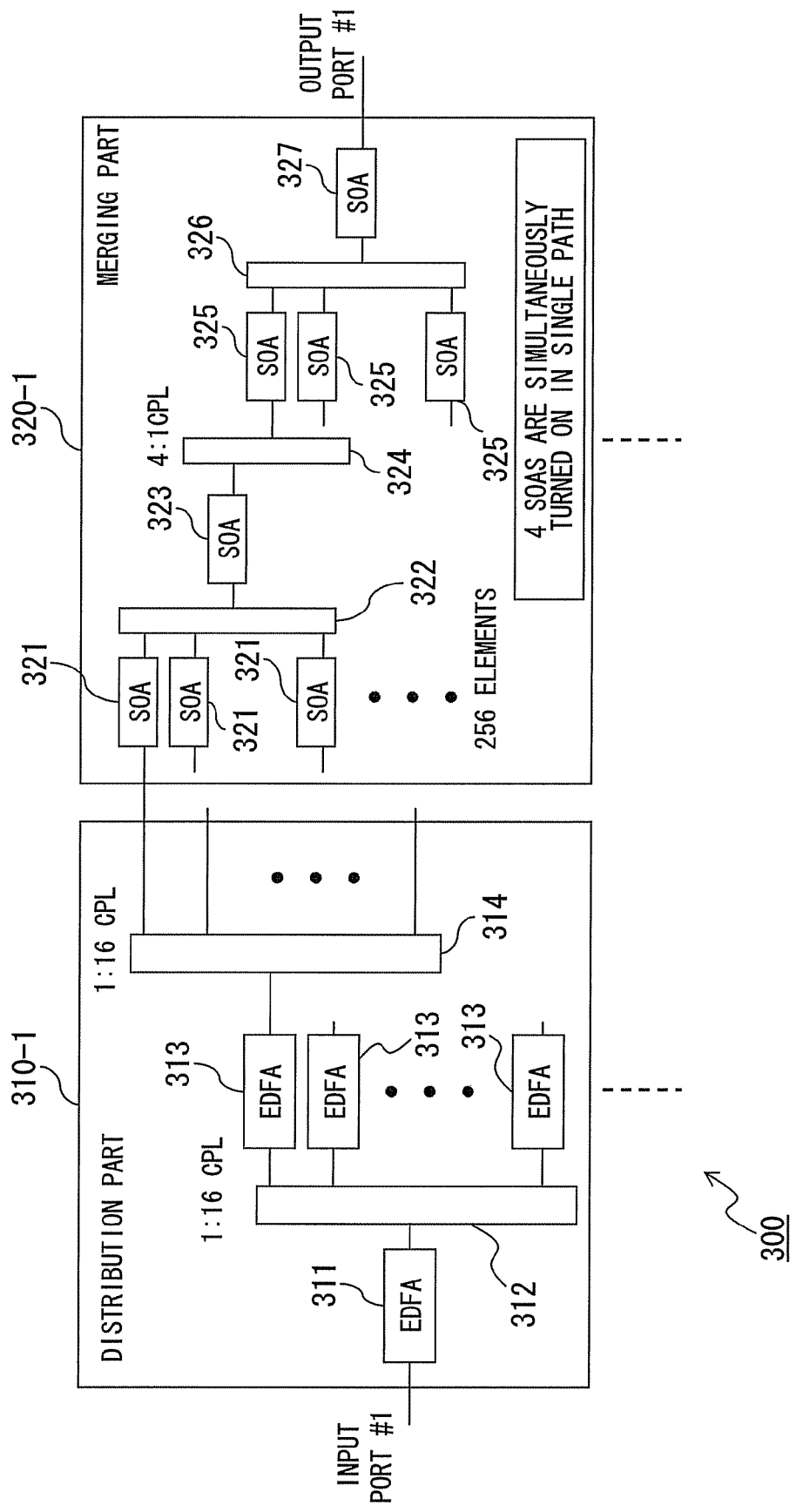
FIG. 17 is a diagram for illustrating application examples of the first to third embodiments.

FIG. 17 illustrates examples of application of the waveform controllers 1, 1A and 1B and the responsive element modules 10, 10A and 10B, which are illustrated in the foregoing first to third embodiments, to another optical packet switch 300. The optical packet switch 300 illustrated in FIG. 17 includes: 256 distribution parts 310-k provided so as to be associated with 256 input ports; and 256 merging parts 320-k provided so as to be associated with 256 output ports (k=an integer of 1 to 256).

It should be noted that in FIG. 17, attention is focused on: components constituting the respective ones of the distribution part 310-1 and the merging part 320-1; and paths through which a pair of input and output ports #1 is connected. Furthermore, the respective distribution parts 310-k have similar configurations, and the respective merging parts 320-k also have similar configurations; therefore, the following description will be made with attention focused on one distribution part 310-1 and one merging part 320-1.

The distribution part 310-1 distributes the light from the input port #1 to 256 distribution paths, and connects the respective distribution paths to one of the merging parts 320-k. Therefore, in one example, the distribution part 310-1 includes, from the upstream side thereof, an erbium-doped optical fiber amplifier (EDFA) 311, a 1:16 coupler 312, sixteen EDFAs 313, sixteen 1:16 couplers 314, and 16×16 EDFAs 315.

The light from the input port #1 is optically amplified by the EDFA 311, and is branched into 16 parts by the 1:16 coupler 312. The respective lights, branched by the 1:16 coupler 312 through 16 paths, are optically amplified by the associated EDFAs 313. The respective lights, transmitted through the 16 paths and optically amplified by the EDFAs 313, are each further branched into 16 parts by the associated 1:16 coupler 314. The respective lights, branched by the 1:16 couplers 314 and transmitted through a total of 16×16 (=256) paths, are optically amplified by the associated EDFAs 315, and output to the associated one of the merging parts 320-k.

The merging part 320-1 is connected one by one with the paths extending from the respective distribution parts 310-k, and merges a total of 256 optical paths to lead the merged path to the output port #1. Furthermore, the merging part 320-1 is formed so that the light from one of the 256 paths is selectively brought into conduction, but the lights from the other paths are shut off. Therefore, in one example, the merging part 320-1 includes, from the upstream side thereof, 256 SOAs 321, thirty-two 8:1 couplers 322, thirty-two SOAs 323, thirty-two 4:1 couplers 324, eight SOAs 325, a single 8:1 coupler 326, and a single SOA 327.

The SOAs 321 perform switching of conduction/shutoff for the light from the respective distribution parts 310-k. Each 8:1 coupler 322 merges the optical paths extending from the associated eight SOAs 321. Each SOA 323 performs switching of conduction/shutoff for the light from the associated one of the 8:1 couplers 322. Each 4:1 coupler 324 merges the optical paths extending from the associated four SOAs 323. Each SOA 325 performs switching of conduction/shutoff for the light from the associated one of the 4:1 couplers 324. The 8:1 coupler 326 merges the optical paths extending from the eight SOAs 325. The SOA 327 performs switching of conduction/shutoff for the light from the 8:1 coupler 326.

Thus, in the merging part 320-1, a total of four SOAs 321, 323, 325 and 327, which are connected by cascade connection and arranged one by one for each stage, are controlled so as to be simultaneously brought into conduction, thereby allowing the light from one of the distribution parts 310-k to be led to the output port #1.

Also in the optical packet switch 300 having the above-described configuration, the rectangularity identifying circuit (see the reference character 203), the arithmetic control circuit (see the reference character 204) and the driving voltage control circuits (see the reference characters 205) may be applied similarly to the case of the optical packet switch 200 illustrated in FIG. 16. Thus, driving signals can be adjusted with ease for as many as (256+32+8+1)×256 SOAs.

It should be noted that also in this case, the shared use of the single rectangularity identifying circuit is enabled. Furthermore, the driving signals are adjusted in sequence from the downstream side SOAs to the upstream side SOAs for each path that constitutes a pair of input and output ports, thereby making it possible to realize efficient and high-precision adjustment of the driving signals for the entire optical packet switch 300.

Furthermore, in adjusting the driving signals for the upstream side SOAs in the path constituting a pair of input and output ports, all of the SOAs located downstream of the SOAs that are to be adjusted are fixed in the ON state. Thus, optical pulses resulting from ASE light generated by the upstream side SOAs are input to the rectangularity identifying circuit via the downstream side SOAs, and can therefore be monitored.

As described above, by application of the illustrated waveform controller 1, 1A or 1B as a component of the optical packet switch 300, a multiport-to-multiport optical packet switch system can be easily configured. In particular, as compared with the case of FIG. 16, the number of optical gate switch elements is larger, but the effect of increasing the efficiency of adjustment of the respective optical gate switches is greater.

[E] Other Features

It should be noted that the control amounts or the like of the control signals supplied to the rectangularity shaping circuit 5b may be stored in the responsive element modules 10, 10A and 10B according to the first to third embodiments in the fabrication processes thereof. For example, after the respective elements of the responsive element module 10, 10A or 10B have been assembled, the above-described driving signal adjustment control, which uses optical pulses resulting from ASE light, is carried out, and then the control amounts or the like of the control signals, supplied to the rectangularity shaping circuit 5b when monitoring results reach control target values, are stored. Thus, at the start-up of the responsive element module 10, 10A or 10B, the SOA 2 can be driven using the control amount stored in the arithmetic control circuit 4; therefore, in addition to achievement of advantages similar to those achieved in each of the foregoing embodiments, the adjustment control of pulse waveforms at the start-up can be omitted, the start-up time can be reduced, and processing load can be decreased.

Further, in the foregoing embodiments, the waveforms of output optical pulses output from the optical gate switch elements are shaped through the adjustment of the driving signals to the optical gate switch elements such as the SOAs. However, the waveform controllers 1, 1A and 1B may naturally be used in shaping the waveforms of output pulses for electric elements, for example. Specifically, since the illustrated waveform controllers 1, 1A and 1B shape the waveforms of driving signals via electric signals, the responsive elements for outputting output pulses to be monitored by the waveform controllers 1, 1A and 1B may naturally be electric elements.

In this case, the responsive element 2 constituting the illustrated responsive element module 10, 10A or 10B is replaced with an electric element, and the function of receiving light in the rectangularity identifying circuit 3, 3A or 3B may be omitted as deemed appropriate. Such responsive element modules can be applied to various electronic devices that handle binary digital signals, and can achieve operational effects as those described in the foregoing embodiments.

Figure 18:
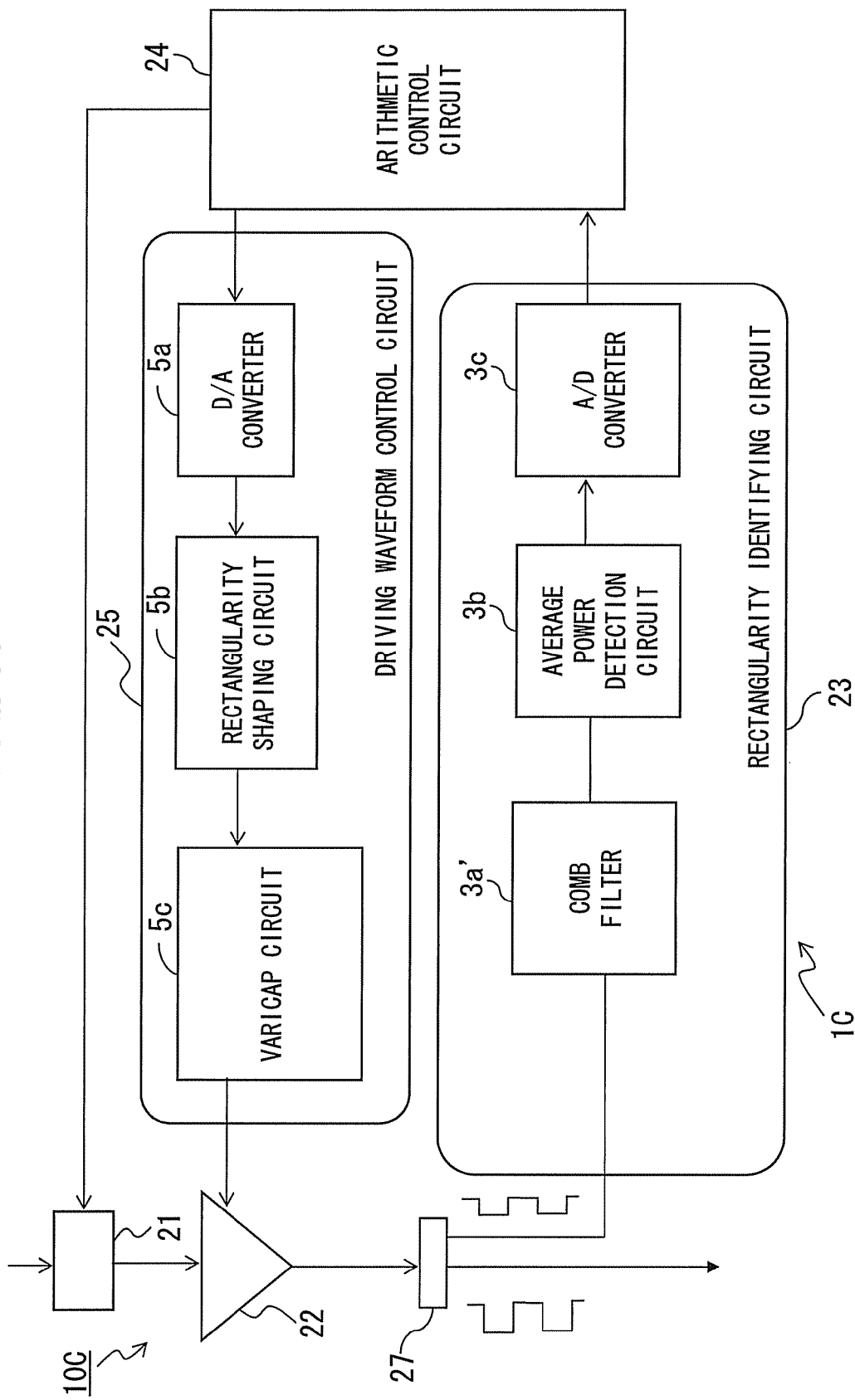
FIG. 18 is a diagram illustrating another embodiment.

FIG. 18 illustrates, by way of example, a waveform controller 1C and a responsive element module 10C when an electric element is applied as a responsive element. The responsive element module 10C includes a switch 21, an amplifier 22, a switch 27 and the waveform controller 1C, and the waveform controller 1C monitors the waveform of an electric signal output from the amplifier 22 to shape, based on a monitoring result, the waveform of a driving signal supplied to the amplifier 22. Thus, the rectangularity of the electric signal output from the amplifier 22 is freely controlled.

The switch 21 performs switching of conduction/shutoff of an input electric signal to the amplifier 22. The amplifier 22 is one example of a responsive element, and amplifies the electric signal, input thereto from the switch 21, based on a gain control signal that is one example of the driving signal whose waveform is controlled by the waveform controller 1C. For an output electric signal output from the amplifier 22, the switch 27 selectively switches the route to either the output route of the responsive element module 10C or the input route of the waveform controller 1C.

As illustrated in FIG. 18, the waveform controller 1C includes a rectangularity identifying circuit 23, an arithmetic control circuit 24 and a driving waveform control circuit 25. The arithmetic control circuit 24 is capable of controlling switching settings of the switches 21 and 27. For example, by controlling the switches 21 and 27, the input electric signal is supplied to the amplifier 22, and an output from the amplifier 22 is led to the output of the responsive element module 10C. Thus, the electric signal transmitted via the amplifier 22 of the responsive element module 10C can be used.

Further, the supply of the input electric signal to the amplifier 22 can be shut off by controlling the switch 21. Moreover, the output from the amplifier 22 can be led to a comb filter 3a' of the rectangularity identifying circuit 23 by controlling the switch 27. In this case, for example, the electric signal (false signal in one example) generated by the arithmetic control circuit 24 may be output to the amplifier 22 through the switch 21.

The rectangularity identifying circuit 23 is one example of a monitor for monitoring the waveform of an output pulse obtained by the response of the responsive element to a driving signal supplied thereto, and the rectangularity identifying circuit 23 includes, in addition to the comb filter 3a', an average power detection circuit 3b and an A/D converter 3c which are similar to those in the foregoing first embodiment. In this case, the electric signal generated by the arithmetic control circuit 24 is amplified by the amplifier 22, and the output electric signal output from this amplifier 22 is input to the rectangularity identifying circuit 23 via the switch 27.

The comb filter 3a' is one example of a harmonic component extraction part. The output electric signal from the amplifier 22 is input to the comb filter 3a' through the switch 27, and the comb filter 3a' extracts even-order or odd-order harmonic components contained in this output electric signal. Thus, the rectangularity identifying circuit 23 outputs, to the arithmetic control circuit 24, the average power value of the even-order or odd-order harmonic components contained in the output electric signal.

The arithmetic control circuit 24 and the driving waveform control circuit 25 are operated in cooperation with each other, and are thus equivalent to one example of a driving waveform shaping part for shaping the waveform of a driving signal based on a monitoring result obtained by the monitor 23. Based on the monitoring result from the rectangularity identifying circuit 23, the arithmetic control circuit 24 controls the gain of the amplifier 22 via the driving waveform control circuit 25.

For example, when the average power value of the even-order harmonic components is received from the rectangularity identifying circuit 23, the arithmetic control circuit 24 outputs a signal for controlling the gain of the amplifier 22 via the driving waveform control circuit 25 so as to minimize this average power value. On the other hand, when the average power value of the odd-order harmonic components is received, the arithmetic control circuit 24 outputs a signal for controlling the gain of the amplifier 22 via the driving waveform control circuit 25 so as to maximize this average power value.

Furthermore, in one example, the driving waveform control circuit 25 includes, in addition to a D/A converter 5a and a rectangularity shaping circuit 5b similar to those in the foregoing first embodiment, a driving circuit 5c equivalent to the one illustrated in FIG. 6. Thus, similarly to the first embodiment, the arithmetic control circuit 24 and the driving waveform control circuit 25 are operated in cooperation with each other, thereby making it possible to shape the rising waveform of a driving signal supplied as a gain control signal to the amplifier 22. As a result, the rectangularity of the output electric signal can attain a target rectangularity.

As described above, also in the example illustrated in FIG. 18, an output electric signal having a target rectangularity can be obtained by simple waveform shaping.

Using the disclosed techniques, a pulse having a target rectangularity can be generated by a simple configuration.

Further, according to an aspect of the embodiments, any combinations of the described features, functions and/or operations can be provided.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A waveform controller, comprising:
   a monitor configured to monitor a rectangularity of a waveform of an output pulse obtained by a response of a responsive element to a driving signal supplied thereto, the monitor being further configured to extract, from the output pulse, an even-order or odd-order harmonic component of frequency of the driving signal and monitor a power containing the extracted even-order or odd-order harmonic component; and a driving waveform shaper configured to shape a waveform of the driving signal based on the rectangularity of a monitoring result obtained by the monitor.

2. The waveform controller according to claim 1,
wherein the driving waveform shaper comprises:
a driving circuit configured to shape, based on a control signal, the waveform of the driving signal supplied to the responsive element; and
a controller configured to output the control signal to the driving circuit based on the monitoring result obtained by the monitor.

3. The waveform controller according to claim 2,
wherein the controller outputs the control signal so that the waveform of the output pulse serving as the monitoring result maintains a given waveform.

4. The waveform controller according to claim 2,
wherein a response time constant of the driving circuit is variable in accordance with the control signal.

5. The waveform controller according to claim 4,
wherein the driving circuit comprises a variable capacitance element, the capacitance of is the variable capacitance element being variable in accordance with the control signal.

6. The waveform controller according to claim 4,
wherein the driving circuit comprises an inductor element, the inductance of is the inductor element being variable in accordance with the control signal.

7. The waveform controller according to claim 1,
wherein the driving waveform shaper shapes the waveform of the driving signal so that the power monitored by the power monitor reaches a given level or falls within a given range.

8. The waveform controller according to claim 1,
wherein the monitor comprises a sampler for sampling the waveform of the output pulse, and
wherein the driving waveform shaper shapes the waveform of the driving signal based on a sampling result obtained by the sampler.

9. The waveform controller according to claim 1,
wherein the monitor comprises:
an edge detector configured to detect a rising edge and a falling edge in the waveform of the output pulse;
a peak holder configured to hold, based on the detection of the rising edge by the edge detector, a value of a rising peak level, which is included in the waveform of the output pulse and responsive to the rising edge of the driving signal; and
a sample holder configured to perform, based on the detection of the rising edge by the edge detector, a sample hold of a value of a response waveform level corresponding to a flat region prior to the falling edge of the driving signal,
wherein the driving waveform shaper receives, as the monitoring result, the value held in the peak holder and the value of the sample hold performed by the sample holder.

10. The waveform controller according to claim 9,
wherein the driving waveform shaper shapes the waveform of the driving signal so that a difference between the value held in the peak holder and the value of the sample hold performed by the sample holder becomes a given value or falls within a given range.

11. A responsive element driven by a driving signal having the waveform shaped by the waveform controller according to claim 1.

12. A responsive element module, comprising:
a responsive element configured to obtain an output pulse in response to a driving signal supplied thereto;
a monitor configured to monitor a rectangularity of a waveform of the output pulse from the responsive element, the monitor being further configured to extract, from the output pulse, an even-order or odd-order harmonic component of frequency of the driving signal and monitor a power containing the extracted even-order or odd-order harmonic component; and
a driving waveform shaper configured to shape a waveform of the driving signal based on the rectangularity of a monitoring result obtained by the monitor.

13. The responsive element module according to claim 12,
wherein the responsive element is a semiconductor optical amplifier for outputting, as the output pulse, an optical pulse output in response to the driving signal.

14. The responsive element module according to claim 13,
wherein the optical pulse is spontaneous emission light.

15. An optical switch apparatus comprising a plurality of optical gate switches configured to perform switching of conduction/shutoff of input light in response to a driving signal, the optical switch apparatus comprising:
a monitor configured to monitor a rectangularity of an optical waveform output from one of the optical gate switches, the monitor being further configured to extract, from the output waveform, an even-order or odd-order harmonic component of frequency of the driving signal and monitor a power containing the extracted even-order or odd-order harmonic component; and
a driving waveform shaper configured to shape, based on the rectangularity of a monitoring result obtained by the monitor, a waveform of the driving signal supplied to the optical gate switch for which the optical waveform output therefrom has been monitored.

16. The optical switch apparatus according to claim 15,
wherein a plurality of the optical gate switches are connected by cascade connection.

17. The optical switch apparatus according to claim 16,
wherein the monitor comprises a photo-detector provided at a position corresponding to an output terminal of a most downstream one of the plurality of optical gate switches connected by cascade connection, and the monitor monitors the optical waveform from an output of a light-receiving element.

18. The optical switch apparatus according to claim 16,
wherein the driving waveform shaper comprises:
a plurality of driving circuits provided so as to be associated with the plurality of optical gate switches connected by cascade connection, the driving circuit each shaping, based on a control signal, the waveform of the driving signal supplied to the associated optical gate switch; and
a controller configured to output, based on the monitoring result obtained by the monitor, the control signal to the driving circuit corresponding to the associated one of the gate switches, among the plurality of driving circuit.

19. A method for controlling an optical switch apparatus in which a plurality of optical gate switches for performing switching of conduction/shutoff of input light in response to a driving signal are connected by cascade connection, the method comprising:

supplying the driving signal to one of the plurality of optical gate switches connected by cascade connection;

monitoring an optical waveform output from the one of the optical gate switches using a light-receiving element provided at a position corresponding to an output terminal of a most downstream one of the plurality of optical gate switches;

shaping, based on a monitoring result obtained by the monitor, a waveform of the driving signal supplied to the most downstream optical gate switch; and sequentially changing the optical gate switch, for which the waveform of the driving signal is to be shaped, from the most downstream optical gate switch to upstream side optical gate switches among the plurality of optical gate switches connected by cascade connection.

* * * * *

UNITED STATES PATENT AND TRADEMARK OFFICE
CERTIFICATE OF CORRECTION

PATENT NO. : 8,582,984 B2  Page 1 of 1
APPLICATION NO. : 12/621130
DATED : November 12, 2013
INVENTOR(S) : Yutaka Kai It is certified that error appears in the above-identified patent and that said Letters Patent is hereby corrected as shown below:

In the Claims:

In Column 29, Line 32, In Claim 6, after "of" delete "is".

Signed and Sealed this
Eighteenth Day of February, 2014

Michelle K. Lee
*Deputy Director of the United States Patent and Trademark Office*